(12) United States Patent
Hollman et al.

(10) Patent No.: US 7,043,848 B2
(45) Date of Patent: May 16, 2006

(54) METHOD AND APPARATUS FOR MAINTAINING ACCURATE POSITIONING BETWEEN A PROBE AND A DUT

(75) Inventors: Kenneth F. Hollman, Carson City, NV (US); Stephen W. Schmidt, Carson City, NV (US)

(73) Assignee: The Micromanipulator Company, Carson City, NV (US)

( * ) Notice: Subject to any disclaimer, the term of this patent is extended or adjusted under 35 U.S.C. 154(b) by 0 days.

(21) Appl. No.: 10/997,432

(22) Filed: Nov. 24, 2004

(65) Prior Publication Data

US 2005/0193576 A1 Sep. 8, 2005

Related U.S. Application Data

(60) Provisional application No. 60/525,300, filed on Nov. 26, 2003.

(51) Int. Cl.
*G01B 5/004* (2006.01)

(52) U.S. Cl. .............................. 33/556; 33/286; 33/502

(58) Field of Classification Search ................. 33/286, 33/502, 503, 556, 558

See application file for complete search history.

(56) References Cited

U.S. PATENT DOCUMENTS

| 3,883,956 | A | * | 5/1975 | Zeewy et al. ................. 33/559 |
| 4,536,661 | A | * | 8/1985 | McMurtry .................... 33/561 |
| 4,815,214 | A | * | 3/1989 | Enderle et al. ............... 33/503 |
| 5,459,939 | A | * | 10/1995 | Kubo et al. ................... 33/559 |
| 5,526,576 | A | * | 6/1996 | Fuchs et al. .................. 33/556 |
| 5,611,147 | A | * | 3/1997 | Raab ........................... 33/503 |
| 6,643,944 | B1 | * | 11/2003 | Yoda et al. ................... 33/558 |
| 6,646,750 | B1 | * | 11/2003 | Christoph .................... 33/559 |
| 2001/0008047 | A1 | * | 7/2001 | Okada et al. ................. 33/503 |
| 2005/0126027 | A1 | * | 6/2005 | Hajdukiewicz et al. ....... 33/558 |

* cited by examiner

*Primary Examiner*—G. Bradley Bennett
(74) *Attorney, Agent, or Firm*—Fitch, Even, Tabin & Flannery

(57) ABSTRACT

A method and apparatus for keeping a probe accurately positioned relative to a device to be tested. The apparatus having a probe and movable probe station element for positioning the probe at a predetermined test position on the device to be tested. The probe station element being driven by a drive to position the probe at the test position, and having a controller connected thereto for substantially keeping the probe at the test position and inhibiting the probe shifting therefrom. In one form the controller is capable of determining the variance between the current probe position and the desired or predetermined test position, and actuating the drive after the variance has reached a predetermined value.

32 Claims, 20 Drawing Sheets

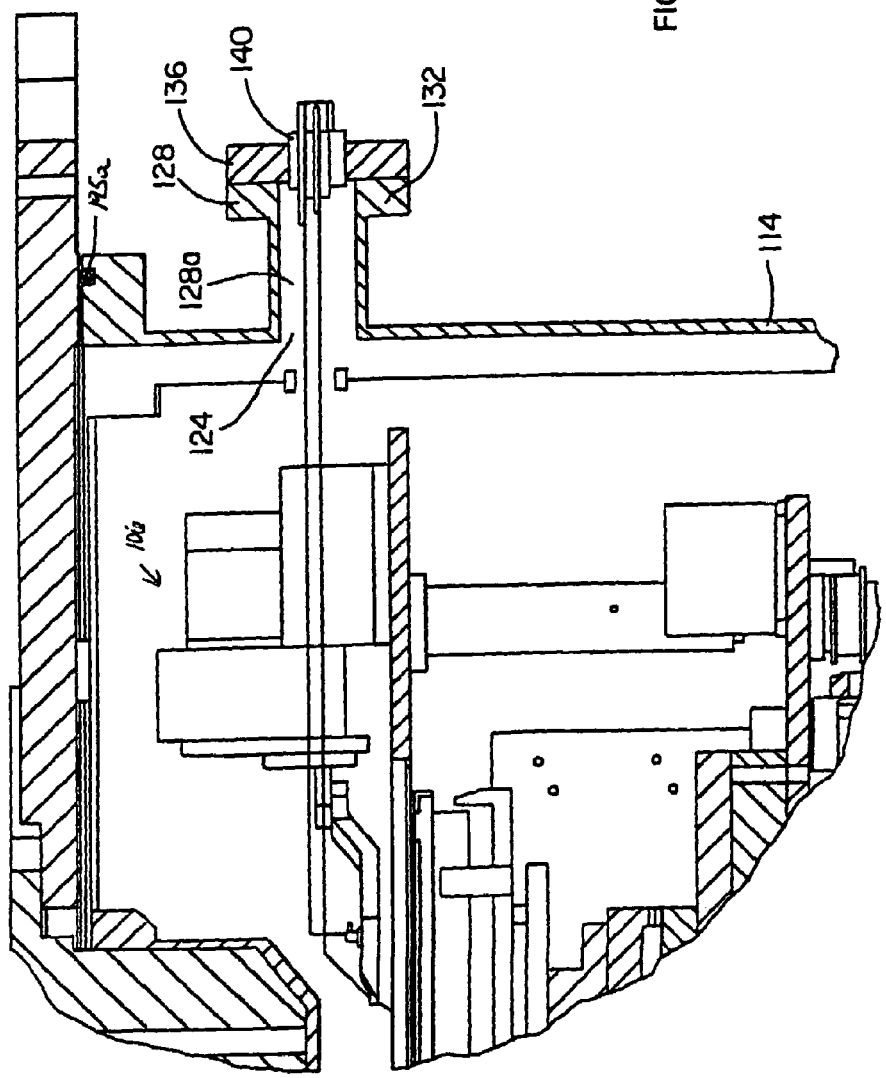

METHOD AND APPARATUS FOR MAINTAINING ACCURATE POSITIONING BETWEEN A PROBE AND A DUT

CROSS-REFERENCE TO RELATED APPLICATION

This application claims the benefit of U.S. Provisional Application No. 60/525,300, filed Nov. 26, 2003, which is hereby incorporated herein by reference in its entirety.

REFERENCE TO COMPUTER PROGRAM LISTING APPENDIX SUBMITTED ON A COMPACT DISC

The computer program listing appendix contained within file "driftset.txt" on compact disc "1 of 1", which has been filed with the United States Patent and Trademark Office in duplicate, is hereby incorporated herein by reference. This file was created on Jul. 27, 2003, and is 27.4 KB in size.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. See MPEP §608.01(v).

BACKGROUND OF THE INVENTION

This invention relates generally to a method and apparatus for keeping a probe accurately positioned relative to a device to be tested and more particularly concerns a method and apparatus for accounting for drift in a high resolution probe station having motor driven stage elements or positioning components.

Probe stations are used to test a variety of integrated circuit specimen and typically include a carrier, such as a chuck, for supporting the specimen and probes for applying and receiving various forms of test signals to or from the specimen. Presently, probe stations are provided in a variety of configurations and with a variety of optional features in order to allow for highly accurate testing of numerous types of integrated circuit specimen such as semiconductor wafers. For example, the probe station itself may be an open-air probe station wherein the manipulators and specimen (or Device-Under-Test (DUT)) are exposed to ambient conditions and viewed with an optical microscope. Alternatively, the probe station may be a totally enclosed structure wherein the manipulators and specimen are contained within a vacuum chamber and viewed with a high resolution microscope, such as a Scanning Electron Microscope (SEM), a Focus Ion Beam (FIB) system, or the like.

The probe station may also include a variety of optional features such as movable platform, carrier and manipulator stage elements, thermal components and environmental controls. In addition, the components of the probe station may have a variety of structural arrangements to allow for different wiring schemes or configurations, such as coaxial and triaxial shielding and guarding arrangements. These configurations and features allow the probe station to test the DUT with a minimal amount of interference (e.g., from noise, etc.) and at or near real-life operating conditions, (e.g., at temperature). For example, a high resolution probe station using a SEM and motor driven platform, carrier and manipulator stage elements to view and test a specimen in a vacuum chamber is capable of greatly reducing (if not eliminating) the effect of noise induced by light and vibration so that highly accurate testing of the specimen may be accomplished. The probe station can further increase the accuracy of the specimen testing by triaxially wiring the probe station and components to eliminate the noise associated with unshielded or unguarded signal lines (e.g., parasitic capacitance, electromagnetic interference (EMI), etc.).

Although these achievements have greatly improved the accuracy with which specimen may be tested via a probe station, they have not eliminated all areas in which improvements are needed. For example, the accuracy of probe stations remains affected by the environmental conditions within which the apparatus is operated. More particularly, environmental conditions, such as thermal buildup, can cause the movable components of the probe station to make unwanted movements, such as drift and wobble. These movements are most noticeable in high resolution probe stations having vacuum enclosures due to the lack of ventilation within the probe station housing and the resolution capabilities of the microscope and components.

Accordingly, it has been determined that the need exists for an improved method and apparatus for keeping a probe accurately positioned on a specimen which overcomes the aforementioned limitations and which further provides capabilities, features and functions, not available in current probe station apparatus and methods.

SUMMARY OF THE INVENTION

In accordance with the present invention, a method and apparatus are provided for keeping a probe accurately positioned relative to a Device Under Test ("DUT"). In particular, the method and apparatus correct for drift that may occur between the probe and DUT, particularly in high resolution microscope probe stations where the probe and DUT are located in a vacuum chamber. In this instance, heat generated during operation of motor drives for shifting of the probe or DUT, or both, to the test position can cause drift of the probe and/or DUT. The method and apparatus herein monitor the amount of this drift and then cause the probe or DUT, or both, to be shifted accordingly so as to compensate for the drift that has been determined. One way the drift can be determined is via a look-up table that includes known drift rates for the various shift axes of the probe station. The amount of drift that is tolerable before compensation occurs can be preset and is preferably adjustable, along with how often the amount of drift is checked. With the above-discussed drift look-up table, the settings will determine the drift amount and dictate how often corrections compensating for drift are made. For instance, the preset drift amount can generally correspond to the resolution of the microscope, e.g. 50 nanometers, or be set to a lower amount so that any drift that occurs is below that which can be detected by the high resolution microscope that is being employed. Further, depending on the axes of movement, drift compensation can be enabled on a select axis or axes, e.g. for x-y drift correction or z drift correction, or both.

It will be understood that while the method and apparatus are described with respect to a high resolution viewing system employing a vacuum chamber for testing operations, the present invention could be implemented in other testing environments. In addition, the probe station herein includes significant flexibility in allowing both the probe and the DUT to be shifted either together or independent from each other. Further, the probe is connected to a probe manipulator assembly that allows for further shifting of the probe independent of the platen on which it is supported. Manifestly, the present drift compensation method and apparatus can be utilized where only the probe or DUT is shifted to the test position, or where the probe is not connected to a manipulator such as with probe cards. Accordingly, while it is the positions of both the probe and the DUT that is monitored where both can be shifted, where one or the other is fixed against movement and thus drift, the present method and apparatus can be implemented to monitor and compensate for the drift of the component that is shifted to the predetermined test position, which usually will be the probe. Nevertheless, it is the position of the probe relative to the fixed DUT that is monitored in this instance so that even where the DUT is fixed the amount of drift that is monitored is the drift of the probe relative to the DUT and away from the test position. Accordingly, herein the terms "relative" or "test" position refers to the position of the probe and DUT relative to each other such as when they are positioned properly for testing operations, whether one or the other is fixed, or both can be shifted.

BRIEF DESCRIPTION OF THE DRAWINGS

Other objects and advantages of the invention will become apparent upon reading the following detailed description and upon reference to the drawings, in which:

FIG. 1I is an enlarged view of the upper right side of the cross sectional view of FIG. 1G with its cover closed;

Figure 1A:
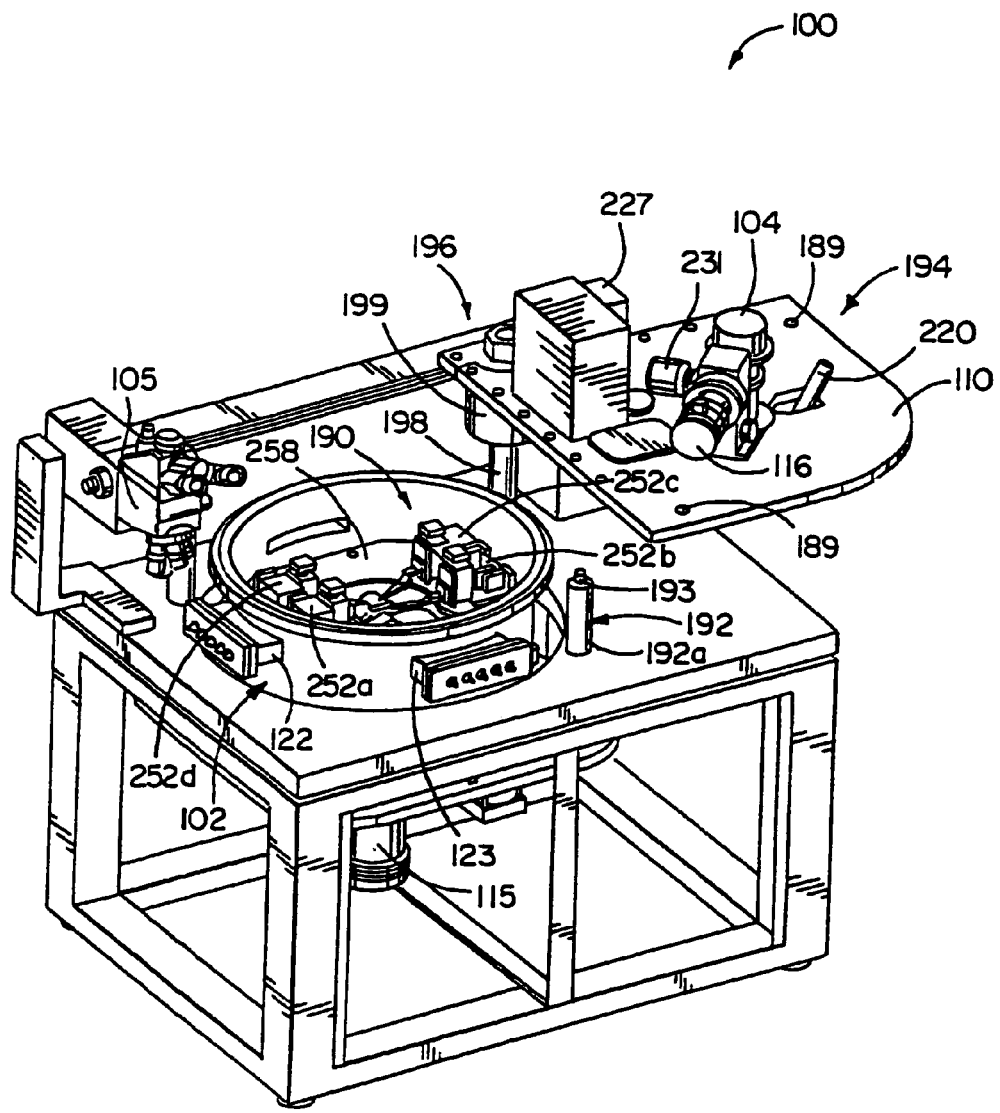
FIG. 1A is a perspective view of a high resolution analytical probe station programmed in accordance with the present invention to maintain accurate positioning between a probe and the DUT, the probe station being illustrated with its cover open.
Figure 1B:
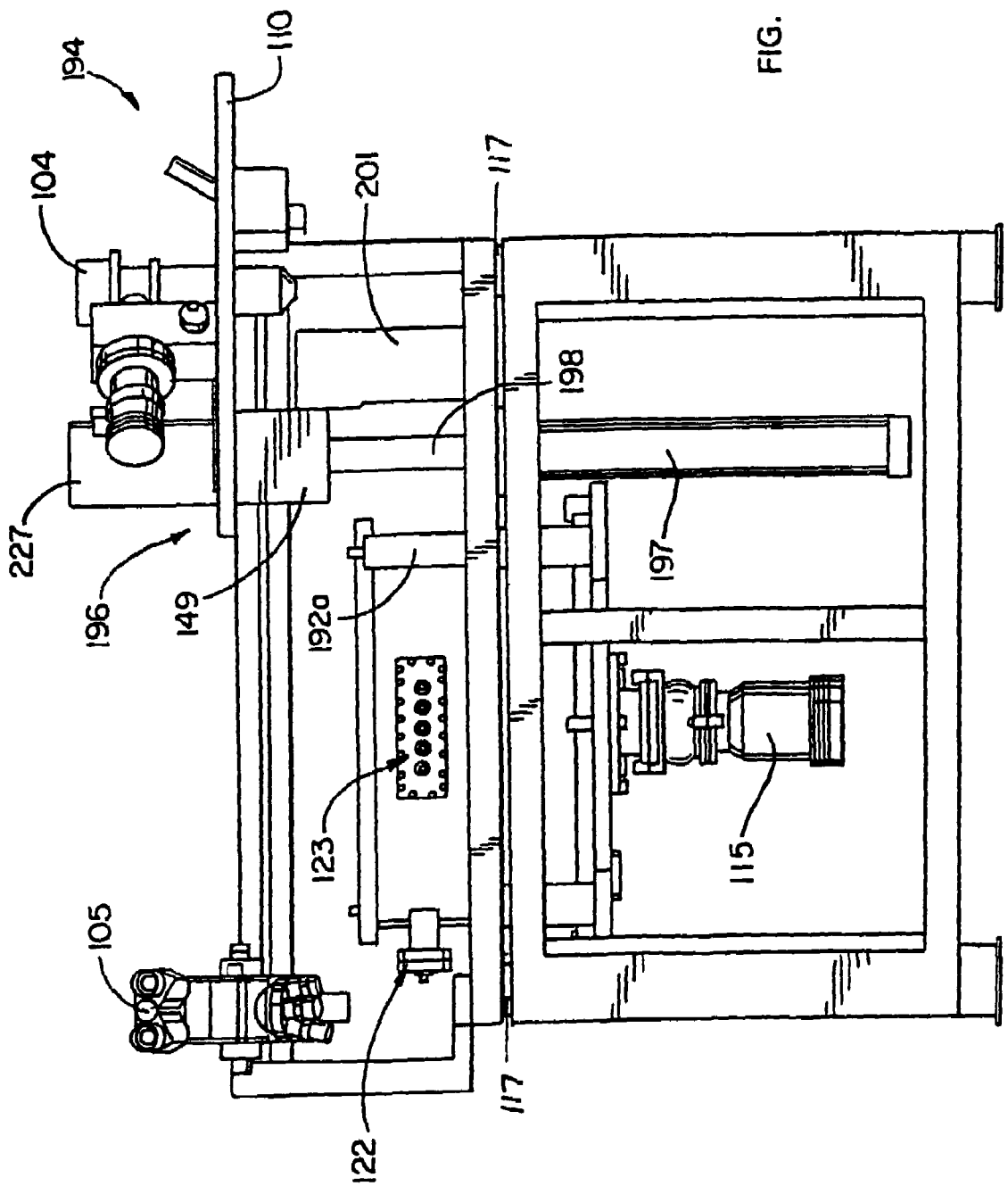
FIG. 1B is a front elevational view of the high resolution analytical probe station with its cover closed.
Figure 1C:
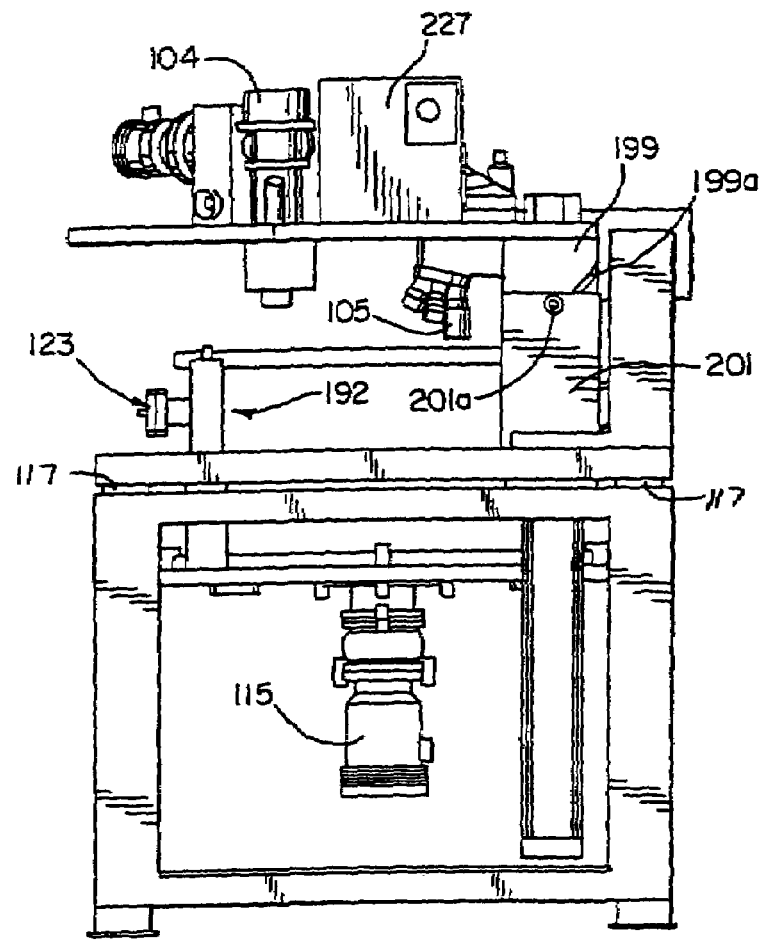
FIG. 1C is a left side elevational view of the high resolution analytical probe station with its cover open.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DESCRIPTION OF THE PREFERRED EMBODIMENTS

A method and apparatus for keeping a probe accurately positioned relative to a device to be tested is disclosed herein. The method and apparatus herein determine if there is a variance between the current probe position and the desired or predetermined probe position, (e.g., drift), and then correct the position of the probe, if deemed necessary. In addition to a probe, the apparatus has a movable probe station element for positioning the probe at a predetermined test position on the specimen. The probe station element includes a drive that is operable to position the probe at the test position, and a controller substantially keeps the probe at the test position and avoids having the probe shift away therefrom. The controller includes software programmed to determine the variance (or drift) between the current probe position and the desired or predetermined test position, and actuates the drive after the variance has reached a predetermined value in order to generally maintain the probe in the desired position (e.g., in order to compensate for drift). Before discussing the method and apparatus in detail, a detailed description of a probe station and its moving parts will be provided in order to orientate the reader although it will be recognized that the present invention is not limited in this regard.

Although the method and apparatus disclosed herein may be employed in probe stations of any configuration (e.g., open-air, vacuum enclosed, etc.) and having any of a variety of optional features (e.g., movable platform, carrier and manipulator stage elements, thermal components, environmental controls, coaxial and/or triaxial wiring configurations, etc.), the embodiments illustrated and discussed herein will focus on a high resolution probe station due to its propensity for being negatively affected by drift. For example, most high resolution probe stations have an enclosed structure, such as a vacuum chamber, which has little or no ventilation and allows thermal buildup to occur. The built-up heat increases the temperature of the probe station components and can cause the materials of the components to expand via thermal expansion. The thermal expansion of materials may result in unwanted movements or drifts in the positioning equipment and probes of the system. Similarly, thermal currents present within the probe station housing may also result in unwanted movements in the system components and particularly in the probes.

High resolution probe stations are also negatively affected by drift in that these systems deal with specimen that require greater accuracy and precision. Therefore, minor movements that are acceptable in some probe stations are less likely to be acceptable in high resolution probe stations. If the system is incapable of accounting for such drifts, it will not be selected for the project.

Drift also negatively impacts high resolution probe stations due to the resolution capabilities of the system microscope. More particularly, the stronger viewing capabilities of a high resolution microscope show more drift than would otherwise be detected. Visible drifting or unwanted movement of the probes will not be acceptable to a user.

A high resolution analytical probe station or system is shown in FIGS. 1A–G, and is generally designated with reference numeral 100. The system 100 is capable of being used in applications where traditional optical (or light) microscopes cannot be used due to the size of the specimen being examined, (e.g., applications which require resolutions that are incapable of being reached by light microscopes). The need for higher resolution probe stations, such as probe station 100, is a result of the electronics industry's drive towards smaller and more complex components, (e.g., the need to conduct low current/low voltage probing at sub-micron levels). For example, integrated circuit specimen which may be tested with a probe station (e.g., the Device Under Test ("DUT")) may include whole wafers, wafer fragments, or packaged parts that require use of a microscope having a resolution greater than any light microscope is capable of providing. Moreover, the size of some DUTs may make it impossible to both view the specimen with a light microscope and position probe assemblies on the specimen because of how close the lens of the microscope would need to be to the specimen in order to view the specimen with the proper resolution; thus, leaving an insufficient amount of space between the lens and the specimen for positioning probes on the DUT.

A detailed description of a high resolution probe station is disclosed in U.S. patent application Ser. No. 10/119,346 filed Apr. 8, 2002 (U.S. Publication No. 2003-0042921 A1 published Mar. 6, 2003), now U.S. Pat. No. 6,744,268 B2, which is hereby incorporated herein by reference in its entirety.

In the form illustrated in FIGS. 1A–G, the microscope utilized is a Scanning Electron Microscope (SEM) 104 provided by R.J. Lee Instruments Ltd. It should be understood, however, that any type of microscope may be used including other high resolution microscopes such as Focus Ion Beam (FIB) systems or X-ray systems. The use of SEMs and FIBs for microscope 104 also allows the system 100 to conduct non-contact probing, such as current path tracing tests and the like, via Electron Beam Induced Current (EBIC) analysis or Optical Beam Induced Current (OBIC) analysis.

Figure 1D:
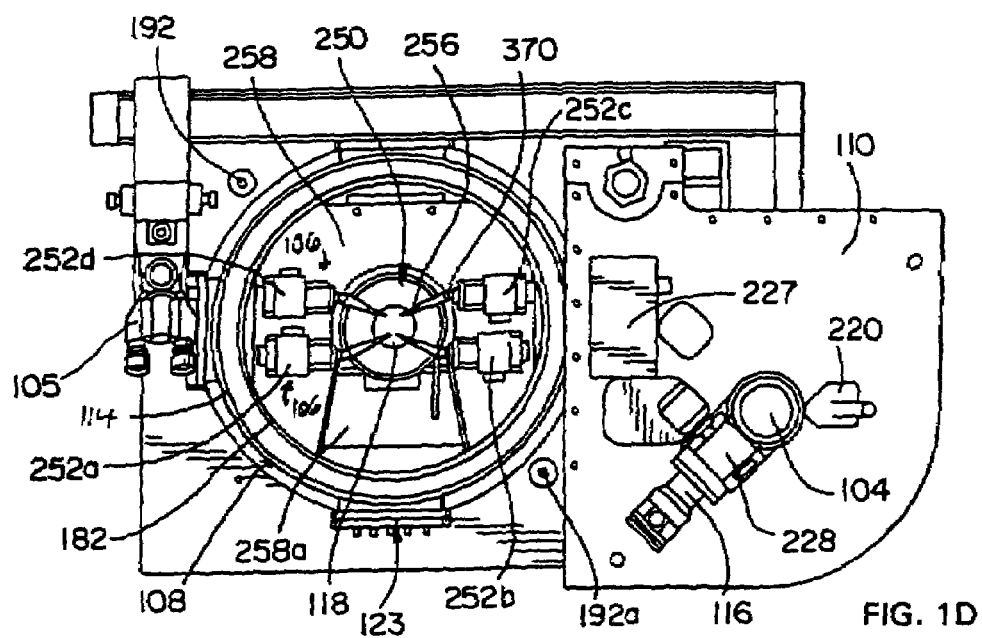
FIG. 1D is a plan view of the high resolution analytical probe station with the cover open.

The probe station 100 generally includes a probe station housing 102, high resolution microscope 104, and several probe assemblies 106, such as the four assemblies shown in FIGS. 1A and 1D. The housing 102, as shown in a preferred form in FIG. 1G, has a double-walled construction, or alternatively may have a single wall construction with an insulated metallic coating applied thereon to allow different guarding and/or shielding configurations to be applied thereto. In the double-walled configuration, the system 100 has an outer housing 108 and an inner housing 182. The housing 102 provides a vacuum chamber 190 in which the probe assemblies 106, carrier 250, platen 258, and specimen 118 are disposed. Accordingly, by having two layers of conductive walls that enclose the chamber 190, the testing area is further isolated from external noise sources by the guarding/shielding configuration in which the housing walls are arranged. To that end, the walls of the respective outer and inner housing portions 108 and 182 of the probe station housing 102 are electrically insulted from each other as by a gap 191 therebetween which optionally can be filled with insulative material to further insulate the housing portions 108 and 182 from each other. In the form shown, the gap 191 is maintained via standoff insulators or housing isolators 192.

More specifically, the housing outer portion 108 has a base wall 112 and an outer side wall 114 upstanding therefrom. At the upper end of the side wall 114, a top cover wall 110 is attached to complete the structure of the outer housing portion 108.

In many low current/low voltage probing applications, the DUT 118 has an increased sensitivity to noise, such as light, electrical interference, air contaminants and vibration. For example, some of the wafers manufactured today for integrated circuits are so small and sensitive that simple exposure to light can induce a current in the circuitry of the wafer 118. Such noise can distort low level test readings or probe readings taken from the wafer unless the light/noise is substantially removed. Thus, the outer housing portion 108 of housing 102 serves as a first barrier for noise reduction by reducing, if not eliminating, many of the traditional elements of noise such as the amount of light that is allowed into the internal space 190 of the housing 102.

Inside the outer housing portion 108, walls of the inner housing portion 182 corresponding to the walls 110–114 of the outer housing portion 108 are provided. As mentioned, alternatively these can be metallic layers applied to the inside surfaces of the walls 110–114 and insulated therefrom. The walled inner housing portion 182 includes a bottom wall 186 adjacent the base 112, top wall 184 adjacent the cover 110, and side wall 188 adjacent side wall 114 and extending between the top and bottom walls 184 and 186 with the corresponding walls separated by gap 191, as previously mentioned. Either the outer housing walls 110–114 or the inner housing walls 184–188, or both, cooperate to form the vacuum chamber 190 of the housing 102 and thus either set of the walls 110–114 and 184–188 where formed as separate members may have a vacuum-type seal therebetween such as between the top wall 184 and the upper end of the side wall 188, as described further herein. The provision of the vacuum enclosure 190 in which the test area is disposed is desirable due to the preferred high resolution or electron microscope 104 employed herein. In this manner, an environment substantially free of gas particles or molecules that could affect the path of electron beams from the electron microscope to and from the target DUT is provided.

The housing 102 has through openings 142 to allow vacuum pump 115 to be connected thereto for drawing down the pressure in the chamber 190 to vacuum conditions. In FIG. 1G, it is shown that the openings 142 extend through the bottom walls 112 and 186 of the housing 102. In the embodiment shown, another vacuum pump 116 is connected to the high resolution microscope 104. Such a configuration allows the microscope 104 to be run at a different vacuum pressure than the chamber which can reduce the amount of surface charging that occurs within chamber 190 due to the presence of an electron beam from microscope 104. For example, if the vacuum within the microscope column is at a pressure of 10-6 Torr, and the vacuum within chamber 190 is at a pressure of 10-5 Torr, a degree of environmental conductivity is created which increases the amount of time it takes to charge the various surfaces within chamber 190 and/or provides a means for dissipating surface charges by bleeding the surface charges created by the beam off of the surfaces in the chamber 190. This is beneficial for a variety of reasons, including the fact that dissipation of surface changes and/or hindering surface charges from occurring reduces the chance that such charged surfaces will interfere with the probing as measurements are taken by system 100. For example, by hindering a surface within the environment from changing, that surface is less likely to generate noise or interference within the chamber 190. This is particularly important when low voltage/low current measurements are being taken therein as they can be influenced or distorted by even the slightest form of noise/interference. In practice, a vacuum state can be reached in the illustrated probe station 100 in approximately three minutes. As is apparent, this time period can be changed by altering the size of the enclosure 190 and/or the capacity of the vacuum pump.

In order to reduce, if not eliminate, the amount of noise such as vibration experienced in chamber 190 due to the operation of vacuum pumps 115 and 116, the vacuum pumps are mounted to the housing using a vibration coupler which absorbs noise generated by the pumps 115 and 116 and allows the pumps to move freely so that they may vibrate as needed. Additional steps for reducing the amount of vibration noise experienced within chamber 190 instruct the use of the vibration isolation table shown in FIGS. 1A–C. This table contains isolators 117 located between the table top and the leg. Furthermore, the housing 102 is suspended from a circular opening in the table top via additional vibration isolation arms not shown, which act as additional means or backup means of vibration isolation.

Through openings are formed in sidewall 114 and aligned with corresponding inner sidewall through openings to provide access openings or feedthroughs 119, 121, 122, 123, 124, 125 and 127 in the housing 102 from the housing exterior to the vacuum chamber 190. These through openings can be used for running leads 120 from an external controller 50 (FIG. 7), such as a computer, into the housing 102. In this way, the probe assemblies 106, actuators for the carrier 250, and other system utilities (e.g., environmental controls, motor drives, etc.) can be remotely controlled externally from outside the vacuum chamber 190 in which these components are operable. The leads 120 can be in the form of electrical cable (e.g., coaxial, triaxial, ribbon, etc.), wiring or conduit for wiring, hydraulic fluid lines, or the like.

Figure 1E:
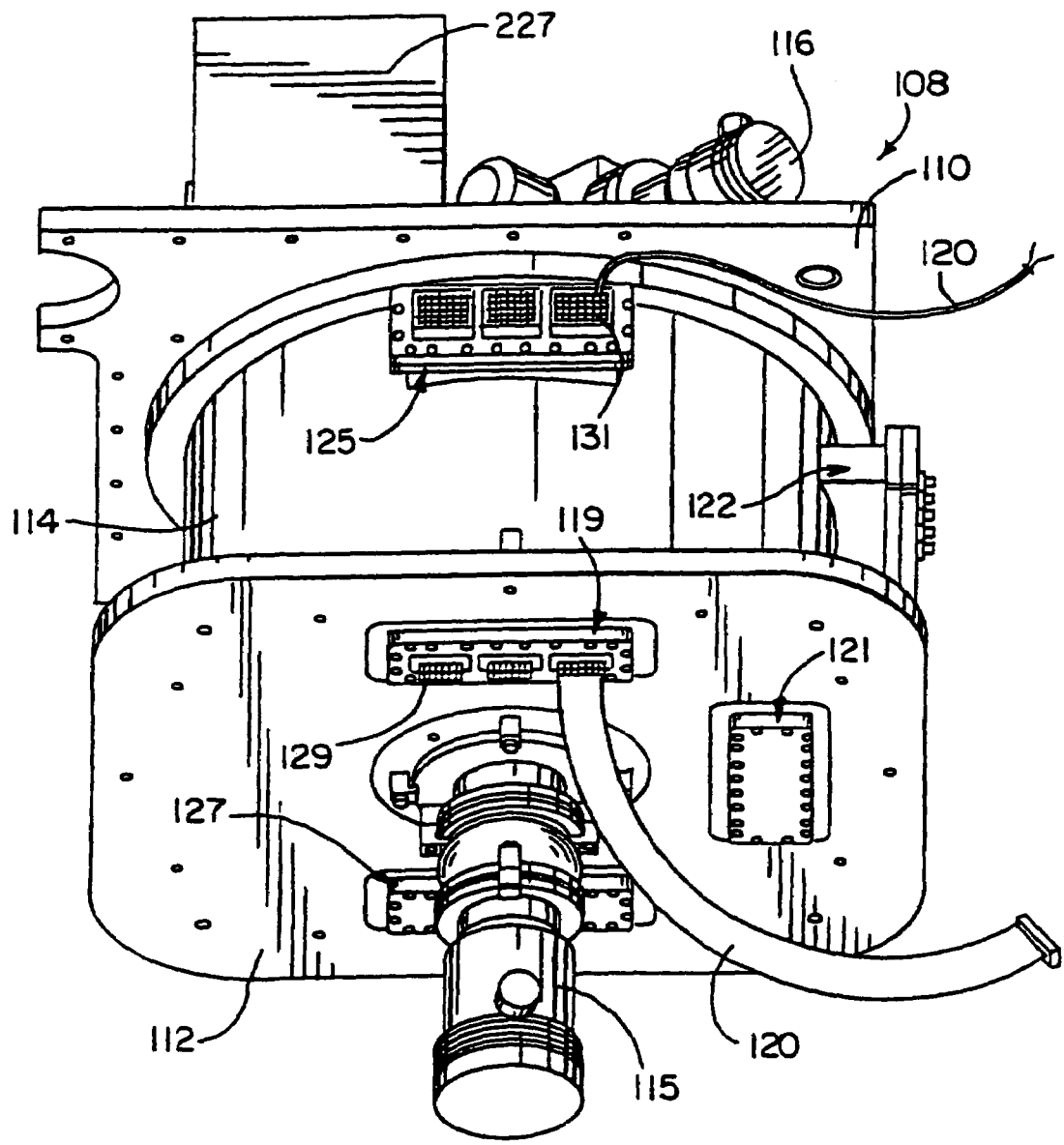
FIG. 1E is a perspective view of the housing of the high resolution analytical probe station taken from below the housing.
Figure 1F:
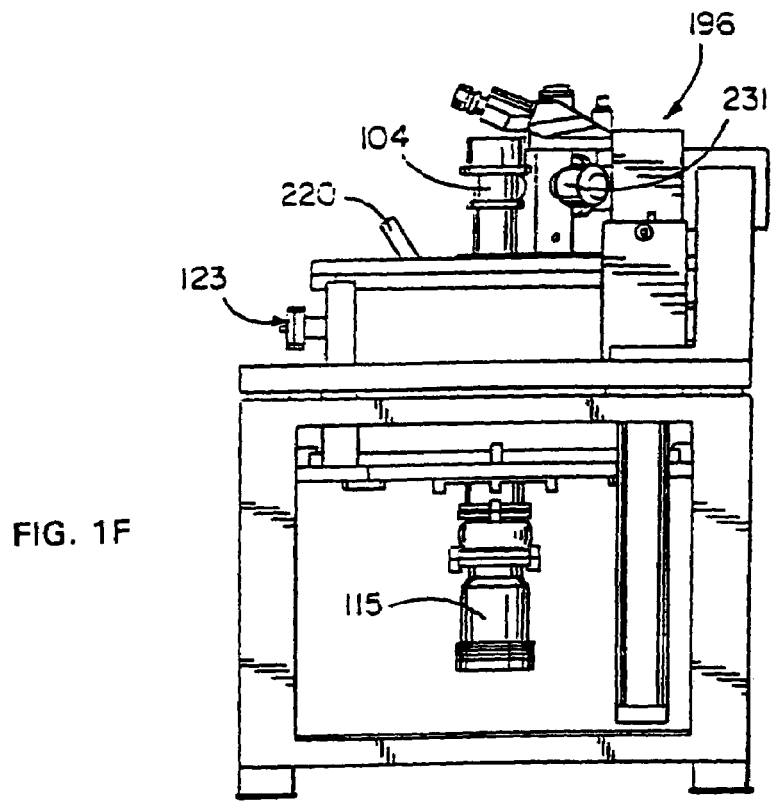
FIG. 1F is a left side elevational view of the high resolution analytical probe station with the cover closed.
Figure 1G:
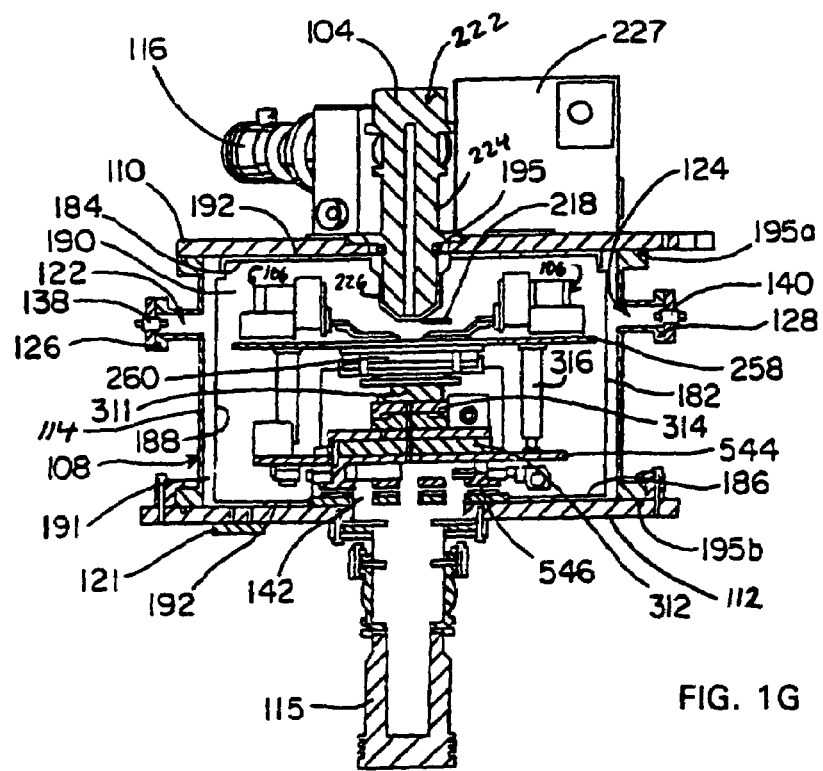
FIG. 1G is a cross sectional view of the high resolution analytical probe station with its cover closed.
Figure 1H:
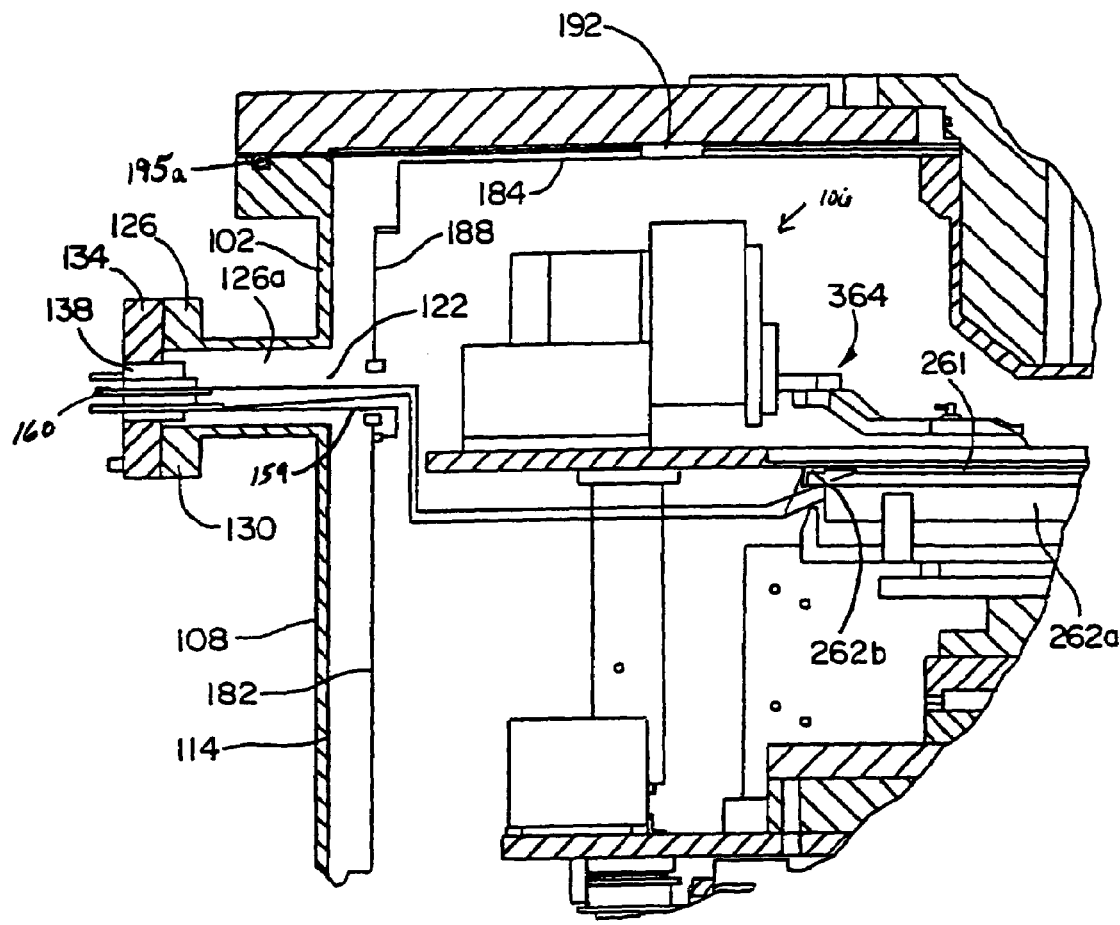
FIG. 1H is an enlarged view of the upper left side of the cross sectional view of FIG. 1G with its cover closed.

The feedthroughs can include flanged connector mounts 126 and 128 schematically shown in FIGS. 1G–I that are secured in the openings 122 and 124 and which include respective passages 126a and 128a extending outward from the sidewall 114 and into which electrical connectors 138 and 140 are secured. The mounts 126 and 128 have radially enlarged flanges or end portions 130 and 132, respectively, to which end caps 134 and 136 are mounted for sealing each passage about the connectors 138 and 140. In this regard, the end caps 134 and 136 can be drilled out to form central openings 134a centrally aligned with the respective passageways 126a and 128a to allow the connectors 138 and 140 to be inserted and mounted therein. Accordingly, access from the exterior of the housing through the passages 126a and 128a and to the interior vacuum chamber 190 is provided via the connectors 138 and 140 which are attached to the end caps 134 and 136. The connectors 138 and 140 allow leads to be passed from the exterior of the housing into the inner enclosure 190 while maintaining a vacuum-tight seal so that the vacuum state can be achieved within the housing 102. Accordingly, the preferred feedthroughs herein include the flanged access ports 126 and 128 and attached electrical connectors 138 and 140, although it will be apparent that other feedthrough constructions may be employed.

The end caps 134 and 136 form a vacuum-tight seal with the flange portions 130 and 132 as by a sealing ring or rubber grommet compressed therebetween for substantially preventing leakage from the ports 126 and 128. The flanged end portions 130 and 132 may be fastened to the end caps 134 and 136 via fasteners such as nuts and bolts which, when tightened, draw the end caps and flanged ends tightly against the rubber grommet and into compression to create a vacuum-tight seal between these components of the housing 102. As will be appreciated, specific configurations of the connectors 138 and 140 can vary significantly. In the preferred form, BNC/coaxial, triaxial, conduit and piping connectors are used as feedthrough connectors 138 and 140.

The flanged ports 126 and 128 and attached end caps 134 and 136 are preferably conductive like the outer sleeves of the connectors 138 and 140. Further, the ports 126 and 128 are mounted to the double-walled housing 102 so as to be electrically connected to the housing outer portion 108. In this manner, the probe station 100 can be grounded via any of the electrically connected outer housing 108, ports 126 and 128, or outer surface of electrical connectors 138 and 140. For convenience, connector 138 is configured in a triaxial manner in FIG. 1H and connector 140 is configured in a coaxial manner in FIG. 1I.

As illustrated in FIG. 1H, a guard portion 159 of the connector 138 can be electrically coupled to the inner housing 182 so that the guard portion 159 and inner housing 182 can be driven to substantially the same potential as the signal line 160 to further isolate the signal from noise and dissipation, as well as, the vacuum chamber 190 from noise; thereby keeping the test area substantially free from electrical interference for accurate measurements at the low testing levels employed by the probe station 100 herein. As is apparent, common grounding and shielding can be employed for the housing 102 and the connectors 138 and 140. In the housing 102 shown in FIGS. 1G, H and I, the outer housing 108 is grounded (or shielded) and the inner housing 182 is guarded.

In FIG. 1I, a coaxial-type connector 140 is shown having a signal line connected to the tip of probe assembly 106 and a shielding line (or ground) connected to the housing of the probe assembly 106. Thus, it should be understood that the housing 102 and internal components therein can be configured in a wide variety of wiring schemes in order to reduce the influence of noise on the specimen being tested.

Other forms of connectors may be used for feedthroughs 138 and 140 so long as they are capable of providing a vacuum tight seal capable of allowing chamber 108 to be pulled into a vacuum state. For instance, flat cable such as ribbon cable 120 shown in FIG. 1E may pass through a vacuum-tight connector such as the PAVE-FLEX connector manufactured by Pave Technology Company, Inc. of Dayton, Ohio, in order to connect circuitry from within the vacuum chamber 190 to a controller located outside the housing 102. In this regard, the feedthroughs 138 and 140 may consist of a disc-shaped insert through which a bulkhead is formed for allowing a flat cable to pass through the insert while maintaining a vacuum-type seal about the cable.

By way of example and not limitation, the bulkhead may be s-shaped or z-shaped to assist in maintaining the vacuum-type seal and support a variety of cable types, (e.g., coplanar, microstrip, stripline, as well as single-strand, stranded, twisted pair, coaxial, triaxial, ribbon cable, and the like). Vacuum-tight, as used herein, does not necessarily mean that a hermetic seal must be reached, but rather means that the seal developed must be capable of allowing the housing interior chamber 190 to be pulled into a vacuum state. By way of example, but not limitation, the feedthrough electrical connectors 138 and 140 may create a seal that has a helium leak rate of less than 1×10–7 cc/sec at one atmosphere.

The probe station 100 may be setup so that a bank of feedthrough connectors can be connected to openings 122 and 124, as shown in FIGS. 1A, B, D and E, with each connector being generally aligned in side-by-side fashion. Alternatively, the probe station 100 may be setup with multiple openings and passages, with each opening/passage having its own connector or feedthrough.

Other types of connectors are shown connected to the system 100 in FIG. 1E. With respect to access opening 119, a bank of integrated circuit headers 129 arranged in a three column/two row format is shown, which may provide electrical connections for various system utilities. With respect to access opening 125, a bank of cable feedthroughs 131 is shown to provide cable access to the vacuum chamber. By way of example, such as approximately one hundred and four coaxial cables 120 can enter/leave the housing 102 via connector 131 without affecting the pressure of vacuum chamber 190.

As mentioned, in order for the housing inner portion 182 to be driven as guard while the outer portion 108 is driven as shield, the housing portions 108 and 182 must be electrically isolated from one another. This electrical isolation can be achieved by using nonconductive material to space the housing portions 108 and 182 apart from one another. In a preferred form, nonconductive rod-shaped standoffs 192 are employed which maintain the housing portions 108 and 182 spaced apart from each other by gap 191. However in alternate forms of probe station 100, the nonconductive material can be sandwiched between the housing portions 108 and 182 throughout the probe station 100, or the housing portions 108 and 182 can consist of conductive coatings on a wall of insulation such as in the single walled construction discussed above.

Top wall portions 110 and 184 include aligned through openings within which the high resolution microscope 104 is mounted for observing and assisting in various probe applications. With respect to top portion 110 of housing portion 108, a vacuum-tight seal is made between it and the microscope 104, so that a vacuum can be pulled in the vacuum chamber 190. In a preferred form of probe station 100, an electrically insulative material, such as rubber, is used to form an O-ring 195 (FIG. 1G) which creates a vacuum-tight seal between the high resolution microscope 104 and the top 110 and can also serve to isolate the microscope 104 from the top 110. One reason for electrically isolating the microscope 104 from the top cover wall 110 is to allow the probe station 100 to be connected and/or wired in a variety of fashions. For example, with the microscope 104 electrically isolated from the top 110, either the microscope 104 or the top wall 110 may be connected to ground while the other is connected to a guard signal. This type of configuration may be desired for providing a guarded surface directly above the DUT 118 for creating optimal low noise testing conditions which will be discussed further below. Additional O-rings 195a and 195b are provided for creating a vacuum-tight seal between the portions 110, 112 and 114 of the outer housing portion 108.

Like the top wall 110, top wall 184 of the inner housing portion 182 also has an opening within which the scanning electron microscope 104 can be mounted so that the bottom portion 226 of the microscope 104 extends into the vacuum chamber 190 of the housing 102. An electrically insulative material is preferably used to isolate the metallic casing of the high resolution microscope 104 from the top wall 184. This material may also be used to perfect a vacuum-tight seal between the microscope 104 and top 184, if desired, or may simply be used to provide an additional or back up means for blocking out noise such as light. With such a configuration, the lower portion of the microscope 104 and the top 184 can be driven the same (e.g., both as guard or both as shield) to offer additional noise/interference protection. If both the microscope 104 and the top 184 are always to be driven to the same potential, it is not necessary to electrically isolate these items; however, a benefit to isolating the microscope 104 and the top 184 is that such a configuration allows maximum flexibility as to how the entire probe station 100 can be setup. For example, the probe station 100 may be setup so that neither the housing portions 108 and 182 nor the microscope 104 is driven as guard or shield. Alternatively, the probe station 100 may be setup so that each of the housing portions 108 and 182 and microscope 104 are used differently, such as doing nothing with the outer housing portion 108, connecting the inner housing portion 182 as shield, and driving the microscope 104 as guard. It also is not necessary to make a vacuum-tight seal between the high resolution microscope 104 and top 184. This is because the seal between microscope 104 and top 110 is sufficient to draw down the pressure in the interior of housing 102, (the vacuum chamber 190), to vacuum conditions. It may, however, be desirable to make the seal between top 184 and microscope 104 vacuum-tight to allow for additional housing configurations.

As shown in FIGS. 1A–D, F and G, the housing 102 contains locating members 192 including upstanding columns 192a connected, at their bottom end, to the support structure 144 and having tapered locating pins 193 projecting up from their upper end for ensuring the proper position of the cover 194 before allowing it to complete the last portion of travel required to close or seal the system 100. Such a design is desirable in that the last portion of travel, in which the cover perfects the vacuum seal and the microscope 104 is lowered downward very near the surface of carrier 250, is critical because failure to have proper alignment could damage the microscope 104, probe assemblies 106, and/or DUT 118. For example, if the cover alignment is off, the microscope 104 could damage its lens or damage a probe assembly 106 by coming into contact with one of the probe assemblies 106. Furthermore, such contact could cause the probe assembly 106 to move and damage the DUT 118. In the illustrated form, a properly aligned cover 194 is allowed to complete the last portion of travel required to close the system when the position orienting members 192 and pins 193 are aligned with openings 189 in the cover. More particularly, during the last portion of travel in the downward direction, the tapered pins 193 are inserted into opening 189 so that cover 194 can be completely closed.

Problems during the last portion of travel in which the cover perfects the vacuum seal between cover 194 and housing 102 via O-ring 195b could also result in making the vacuum pumps 115 and 116 work harder then they need to thereby waisting energy and/or preventing the vacuum chamber 190 from ever reaching its desired state or pressure. Thus, by providing locating members 192, the system 100 further ensures that the proper vacuum tight seal will be made when the cover 194 compresses the O-ring 195b against its lower surface and the upper surface of housing 102.

As seen best in FIGS. 1F–G, the high resolution microscope 104 of probe station 100 has a generally cylindrical or column shaped housing or casing including an upper portion 222 and intermediate portion 224 projecting upwardly from the cover 194. An electron gun is located in the upper portion 222, lenses and deflection coils in an intermediate portion 224, and a final lense and aperture located in a lower portion 226. It is preferred that the microscope 104 include a shutter 218 which contains holes or slits such as every five degrees for reducing the duty cycle of the beam 206 of microscope 104 as discussed above. This configuration allows the probe station user to continually update the microscope image while minimizing the amount of damage to DUT 118. In addition, to further assist in reducing noise within chamber 190 and/or obtaining low current/low voltage readings, the shutter 218 may be configured such that it can be connected to guard or shield in keeping with the feasibility of the system configuration afforded by the present invention and as has been discussed previously. For example, the shutter 218 may be electrically isolated from the microscope 104 so that it may be wired to guard while the microscope 104 is shielded, or the microscope 104 and the shutter 218 may be electrically connected to one another in instances where both items will be connected in a similar fashion.

The microscope 104 is positioned so that at least part of the lower portion 226 extends below the tops 108 and 184 and into the chambers 108 and 182. A power supply 227 is located atop the cover 194 near the microscope 104 for supplying power to the same during high resolution probing with system 100. In addition, an electron collector 220 extends through the cover 194 near the microscope 104 and is positioned at an oblique angle to the plane of the cover 194 in order to collect the electrons from the beam 206 deflected off of the DUT 118 to provide a high resolution image of the target area. These components can be arranged in a variety of positions about the system 100, however, in a preferred form the electron collector 220 is positioned so that it will be located at the front of the system 100 when the cover 194 is closed. Such a configuration allows for additional probe assemblies 106 to be added along the rear side of the chamber 190 in clearance from the front mounted collector 220. The front mounting of the collector 220 also makes it easier for the system operator to access the probe assemblies 106, carrier 250, stages and motor drives, etc., as well as, determine where the probe assemblies should be positioned so that they do not interfere with the microscope 104, electron collector 220 and other components of the cover 194. This configuration also leaves the removable portion of the platen 258 free from components so that a system user can quickly and easily get access to the carrier 250, stages 311, 312, 314, 316 and platform 544 through opening 258a.

The portions 220, 222, and 224 of microscope 104 may also be electrically isolated from one another so that the probe station 100 can be configured in a variety of ways, (e.g., with some portions connected to ground, others connected to guard, etc.), as discussed above. For example, in one form the lower portion 226 is electrically isolated from the upper and intermediate portions 222 and 224 so that the lower portion 226 can be connected to a guard signal to further reduce noise/interference such as parasitic capacitance and EMI as discussed above, and the upper and intermediate portions 222 and 224 can be connected to ground to reduce the risk of electrical shock to a probe station user. Again, such a configuration allows the probe station to be connected in a triaxial arrangement having the DUT 118 surrounded by a guard layer formed by top 184, bottom 186, sidewall 188, and lower scope portion 226, and further surrounded by a shield layer formed by top 110, bottom 112, sidewall 114 and upper and intermediate scope portions 222 and 224. In a preferred form, however, the microscope 104 and outer housing 108 are shielded and the inner housing 182 and shutter 218 are connected to guard. Thus the DUT 118 will be surrounded by a guard layer and a shield layer in order to reduce noise and allow for optimal probing/measurement conditions.

Inside the housing 102 are the operating components of the probe station 100 for probing of the specimen including a carrier 250, (e.g., a chuck, fixed probe card, socket stage adapter and its respective socket cards, etc.), and a plurality of manipulators 252a, b, c, and d, each including conductive portions in the form of probes 256 for testing DUTs such as electronic components or specimens 118. In general, the carrier 250 is used to support the specimen 118 in a rigid and fixed position during testing. Preferably, the carrier 250 (or the stages attached thereto) is capable of moving the specimen in the X, Y and Z directions and/or rotate in the theta direction. The manipulators 252a–d are mounted on a support or platen 258 which is located within the vacuum chamber 190 and includes a central opening which provides access for the probes 256 to the carrier 250 located beneath the platen 258. Although four programmable manipulators are shown, the system can be set up to handle additional manipulators. For example, in one form the system 100 may be setup using six manipulators having at least 10 nm resolution and 0.5 inches of travel in all axis.

In a preferred form, the platen 258 has an access panel which can be opened and/or removed in order to give the system operator access through opening 258a to support portions of the carrier 250, motor drive systems, and additional components located within chamber 190. In the embodiments shown in FIGS. 5D and 24, the access panel has been removed to show the opening 258a covered thereby.

The manipulators 252a–d operate to position their associated probes 256 about various conductive path indicia, or test points, located on the surface of the specimen 118. Prior to discussing further operation of the probe assembly 106, however, each component of the probe assembly 106 will be discussed in further detail below.

The carrier shown in FIGS. 1A–I is a chuck 260 which is generally circular in shape and is used for supporting the specimen or DUT 118 which is to be probed. The chuck 260 may range in complexity from simple single layer disk shapes to more complex multi-layered shapes. An advantage of using a multi-layered configuration is that the noise reduction principles associated with the various shielding and guarding configurations discussed above with respect to housing 102 can be applied to the carrier 250 as well. For example, the chuck 260 can be configured in a coaxial or triaxial arrangement in order to minimize the effects of parasitic capacitance and/or EMI by reducing the number of available conductive surfaces which can be charged and protecting the DUT 118 against interference from external electromagnetic fields.

In addition to the variety of chuck configurations that can be used for carrier 250, the probe station 100 may also use chucks having any number of chuck features such as thermal capabilities. For example, the chuck 260 may be a thermal chuck which is capable of raising and/or lowering the temperature of the chuck 260, thereby allowing the DUT 118 to be tested at temperature. The ability to test at temperature allows the DUT 118 to be tested in simulated application conditions thereby allowing testing to more accurately reflect use conditions of the DUT 118. The temperature of a thermal chuck may be raised above ambient temperatures via resistive wiring which is cast into one of the layers of the chuck 260. One of the benefits of conducting tests at temperature in a vacuum environment is that the test measurements will not be affected by environmental side effects from raising and lowering the temperature. For example, when the thermal chuck is lowered to temperatures well below ambient temperatures, frost will not occur due to the vacuum environment. Similarly, when the thermal chuck is raised to temperatures above ambient temperatures, humidity will not occur due to the vacuum environment.

In order to heat the chuck, electrical current is run through the wire causing the wire and sheathing to heat up and radiate heat throughout the apparatus 100. The more current that is run through the wiring, the more heat is generated due to the resistive nature of the wiring. Therefore, in order to increase the temperature of the probe station 100, the probe station user need only increase the amount of current that is being fed through the wire. In order to maintain the desired temperature for testing the DUT 118 at temperature, the chuck 260 has temperature sensors (not shown) which are capable of detecting the temperature of the probe station 100. In one form, the temperature sensor can be a thermocouple attached to the chuck 260. As the temperature of probe station 100 begins to fall below the desired testing temperature, more electrical current is applied to the wire, causing the wire to radiate more heat and increase the temperature of the probe station 100. As the temperature begins to rise above the desired temperature for testing, less current is applied to the wire causing the wire to radiate less heat.

The temperature of the thermal chuck may be lowered below ambient temperatures by passing a coolant or heat transfer fluid through conduit (or piping) which is cast in one of the layers of chuck 260. Typically the coolant is a liquid or vapor and the conductive element within which the conduit is cast is made of a good thermal conductor such as cast aluminum so that heat transfer can readily take place throughout the probe station 100 thereby allowing the vacuum chamber 190 to be raised or lowered to the desired temperatures. In order to lower the temperature of the probe station 100, the probe station user need only increase the amount of fluid being sent through the conduit which in turn will lower the temperature of the probe station 100 via heat transfer. As discussed above, the chuck 260 may contain a temperature sensor such as a thermocouple to monitor and maintain the desired temperature of the chuck 260. As the temperature begins to raise above the desired probing temperature, more fluid is sent through the conduit thereby lowering the temperature of the system. As the temperature begins to fall below the desired testing temperature, less fluid is sent through the conduit. In alternate forms of the chuck 260, the heating of system 100 may be accomplished in a similar manner to the cooling described above, (e.g., passing heating liquid or vapor through tubes).

With the many alternatives and options discussed above regarding chucks, it should be clear that the type of chuck used with probe station 100 depends on what type of testing or probing is to be completed and what type of information is to be gathered, (e.g., is probing being done at ambient conditions or at temperature, is a triaxial chuck necessary or not, etc.). In alternate forms, the probe station 100 may be setup using any one of the chucks manufactured and sold by The Micromanipulator Company, Inc. More particularly, the probe station 100 may be setup using one of the chucks described in Micromanipulator's copending U.S. patent application Ser. No. 09/815,952 filed on Mar. 23, 2001, now U.S. Pat. No. 6,700,397 B2 (the '397 patent), which is hereby incorporated herein by reference in its entirety. For example, in a preferred form, the chuck 260 may be Micromanipulator's CHK 8000-A thermal triaxial chuck, which is one of the chucks disclosed in the '397 patent. The CHK 8000-A can be configured for either coaxial or triaxial configurations, ambient or thermal applications, and offers a high level of performance for low noise probing. However, although the Model CHK 8000-A chuck is identified as a preferred embodiment, the probe station 100 may use any number of different chucks, including conventional ambient chucks, thermal chucks, low noise chucks, and the like.

In other testing configurations, carrier 250 may be in the form of a socket stage adapter and socket card instead of chuck 260. Once the socket stage and card have been connected to probe station 100, the integrated circuit dye package can be tested and run as if it was installed in its actual end product. For example, if the component is typically operated in a high temperature environment, the environment of chamber 190 can be raised to that temperature and then probed to ensure that it is operating correctly and/or to determine why it is not operating as it should. Typically the upper portion of packaging is removed via a process known as de-lidding in order to expose the conductive path indicia of the integrated circuit so that additional testing/probing can be performed. More particularly, the upper portion of package may be removed by acid so that probes 256 can be positioned about the conductive path indicia located within package and the device can be probed.

The probe assemblies 106 of FIGS. 1A, D, G–I and 2 include manipulators 252a–d which operate to position their associated probes 256 about various conductive path indicia or test points located on the surface of the specimen or DUT 118. Each manipulator 252a–d is mounted on a base 350 which is in turn attached to the platen 258. Some forms of manipulators utilize magnetic mounting bases or vacuum/suction mounting bases to attach the manipulators to the platen 258. For example, the mounting bases 350 may be made out of magnetic material which is capable of securing the manipulators 252a–d to a platen 258 made out of magnetically attractive material such as metal. In a preferred form, the manipulators 252a–d are hard mounted (e.g., bolted) to the platen 258 in order to provide maximum stability for precision probing.

Slidingly coupled to the mounting bases 350 are the manipulator block body assemblies 352 which include the control or adjustment mechanisms that are used to position the probes 256. The manipulators 252a–d utilize screw drive adjustment mechanisms having threaded shafts driven by motors capable of precisely positioning probes 256, such as by a stepping motor, servomotor or the like. The position adjustments for manipulators 252a–d may be made automatically via a controller, such as a computer, which operates X, Y and Z position adjusting mechanisms 354, 356 and 358 in order to adjust the probes 256 in the X, Y and Z directions, respectively. More particularly, the motors of position adjusting mechanisms 354, 356 and 358 may be operated to rotate their associated screws thereby causing blocks 354a, 356a and 358a to slide back and forth in the X, Y and Z direction respectively. The block portions 354a, 356a and 358a of the block body assembly 352 have slide bearing surfaces and guides which allow for relative sliding movement of the block portions upon actuation of the mechanisms 354, 356 and 358.

Figure 2:
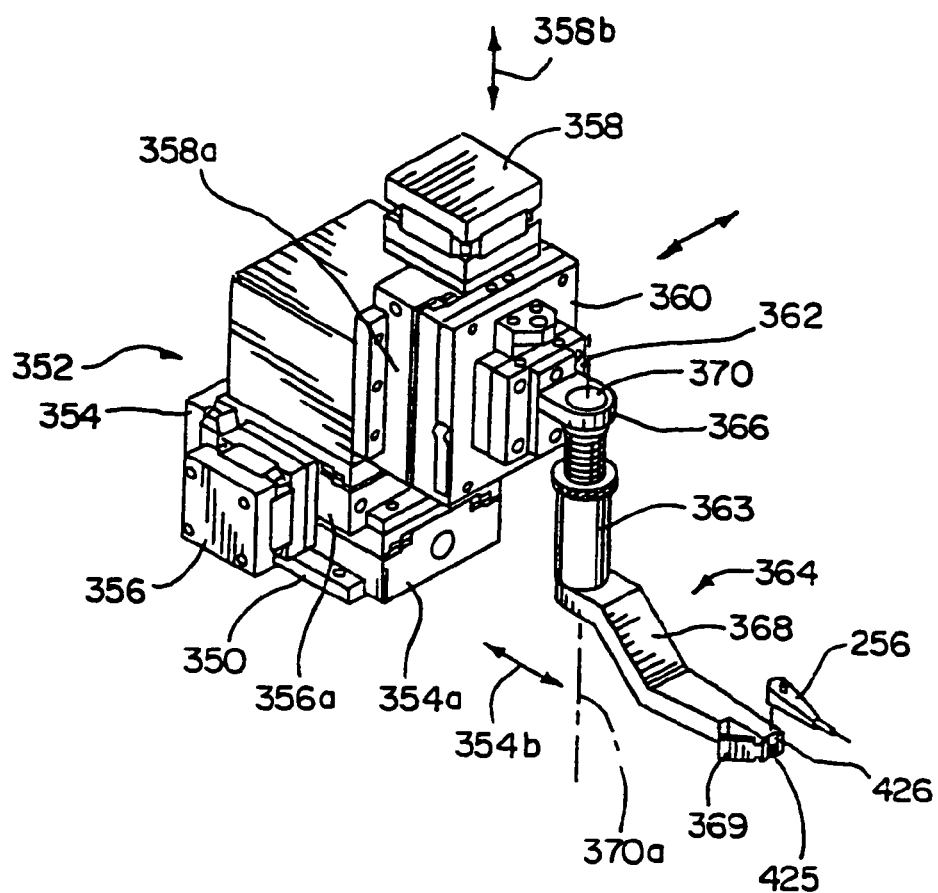
FIG. 2 is a perspective view of a probe assembly used in the high resolution analytical probe station.

In FIG. 2, actuation of the X-adjusting mechanism 354 causes the corresponding screw drive to be driven or rotated thereby moving block 354a, along with the remaining portions of the manipulator assembly that rest on block 354a (e.g., Y-adjusting mechanism 356, Z-adjusting mechanism 358, manipulator arm support plate 362, extension 363, arm assembly 364, and probe 256). This movement translates into moving the face 360 of the manipulators 252a–d forward or backward in the direction identified by arrow 354b. A portion of the cavity within which the screw of the X adjustment screw drive mechanism is rotated can be seen in block 354a of FIG. 2. The Y-adjusting mechanism 356 causes its corresponding screw drive to be rotated thereby moving block 356a, along with everything resting thereon (e.g., the Z-adjusting mechanism 358, manipulator arm support plate 362, extension 363, arm assembly 364, and probe 256). This movement translates into moving the face 360 left and right as identified by arrow 356b. The Z-adjusting mechanism 358 causes its corresponding screw drive to be rotated thereby moving block 358a, along with everything connected thereto (e.g., manipulator arm support plate 362, extension 363, arm assembly 364, and probe 256),. This movement translates into moving the face 360 up and down in the direction identified by arrow 358b.

In FIG. 2, the support plate 362 is attached to the face 360 for mounting the arm assembly 364 to the manipulator. The arm assembly has members 366 and 368 that project out forwardly from the manipulator assembly and connect to the probe 256. In a preferred form, the probe 256 is connected to lower member 368 via a probe retaining mechanism such as spring clip 369, and the arm assembly 364 includes an adjustment mechanism 370 positioned at the joint connecting upper and lower members 366 and 368, respectively. The adjustment mechanism 370 is used to pivotally adjust the lower member 368 about vertical axis 370a with respect to the upper member 366, which is fixed to support plate 362. In the form illustrated in FIG. 2, arm extension 363 is used to increase the lower reach of the arm assembly 364. More particularly, the arm extension (or collar) 363 is used to separate arm members 366 and 368 by a desired vertical distance. In the illustrated embodiment, extension 363 does not alter the ability to pivotally adjust lower member 368 with respect to upper member 366 and is attached to the upper and lower members via a screw and/or bolt relationship.

Once the manipulators have positioned the probes 256 in the desired locations, the probes 256 will be placed into contact with the DUT 118 and testing/probing will begin. The actual placement of the probes on the DUT 118 may involve the use of a variety of motion control mechanisms and sensors, and will be discussed further below with respect to the operation of probe station 100.

The manipulators 252a–d, shown in FIGS. 1A, D, G–I and 2, are Micromanipulator Model 900VM manipulators. At 0.01 microns, the 900VM manipulators offer very high manipulator resolution and features such as an indexed rotational nose piece, probe arm with fast tip changing capacity, and stable mounting with preset stable mountings. As mentioned above, however, a variety of different probes and manipulators may be used with system 100.

In addition to using a variety of manipulators, the system 100 may also use a variety of probes 256. For example, the manipulators 252a–d may use a triaxial probe, or may use any one of a variety of different probes, such as a coaxial probe, a RF/Microwave probes, etc. As mentioned above, the probe assemblies 106 also include probes 256, which are used to acquire and apply test signals to the DUT 118 during testing. The probes 256 are mounted to the lower members 368 of the manipulator arms 364 and are positioned according to the procedures discussed above with respect to the manipulators 252a–d. For optimal probing, triaxial probes which contain a center conductor surrounded by a guard conductor and a shield (or ground) conductor can be employed. The triaxial configuration of probe station 100, including its components such as the carriers 250 and probes 256, minimizes noise and allows for more accurate testing of the DUT 118 by shielding the DUT 118 from external EMI and reducing the effects of parasitic capacitance and other interferences via a blanketing guard layer.

In order to provide for quick and easy replacement of the probe 256, the manipulator arm 364 includes a release mechanism, such as a spring loaded latch in the form of spring clip 369, which engages the dove-tail flange portion of the probe 256 when released, and disengages when depressed or squeezed (e.g., causing the spring to be compressed). More particularly, when probe 256 is to be inserted onto manipulator arm 364, the user depresses the release mechanism 369 to provide clearance for sliding the dove-tail flange portion 424 down into the mating recess 426 until it is received fully within the mating recess 426. Releasing the spring latch 428 allows it to pivotably return to the spring loaded securing position with its forward end pushing the rear flange portion 424 of the probe tightly against the surfaces of the recess 426 so that the probe housing 400 is tightly and securely frictionally held in the mating recess 426.

A stop may be provided so that the user can more easily determine when the probe 256 is fully inserted into the recess 426. For example a lip may be provided on the bottom of recess 426 which will prevent the dove-tailed flange portion 424 from sliding completely through the mating recess 426 from top to bottom. In another form, a detent mechanism such as a spring loaded ball and socket may be used to assist the user in determining when the probe 256 has been fully attached to the arm 364. In the form shown, a lug 425 is provided on the surface of the recess 426 which is guided into a rear channel of the probe and prevents the probe from being inserted further once the lug 425 engages a lip located on the end of the probe 256.

In view of the probe tip replacement capabilities discussed above, and in order to reduce the time necessary for replacement and to increase the accuracy of the probes 256 once a new tip 412 has been inserted, a probe presetting station may also be used. In such cases, the probe 256 may be placed on a fixed link similar to the manipulator arm 364, so that the replacement probe tip 412 can be adjusted to ensure that it is in the same relative position as the previous probe tip and to ensure that it is the same relative length of the previous probe tip, (a process referred to as probe tip refresh). Once the probe tip refresh is complete, the probe 256 may be re-inserted onto the manipulator 252a–d so that testing can commence. Since the probe tip 412 is now very near the same position with respect to the probe 256 as the previous probe tip, the probe station user will spend significantly less time getting the probe station 100 ready to test/probe. Like the chuck 260 and housing 102, the probes 256 can be setup and wired in a variety of ways, preferably with either a triaxial configuration or a coaxial configuration.

In other forms of probe station 100, other types of probes may be used. For example, the probe station 100 may use a triaxial probe similar to the one disclosed in U.S. patent application Ser. No. 09/815,952, filed on Mar. 23, 2001, now U.S. Pat. No. 6,700,397 B2, which is hereby incorporated herein by reference in its entirety. The user may wish to change the attack angle to accommodate the physical space limitations of the probe station and spacial orientation of integrated circuits present in a given test application. The detachable connection with which probe tip is connected to probe 430 permits probe tips of different attack angles to be quickly and conveniently interchanged by the user when a different attack angle is desired. Probe tips having attack angles from 45 to 70 have been found to be suitable for many test applications, although attack angles can be tailored to angles outside this range as may be necessary in certain test setups.

The probe station 100 may also be equipped with a probe touchdown sensing mechanism so that the probes 256 do not damage the DUT and/or conductive path indicia during testing. This is particularly true when it comes to testing/probing expensive DUTs such as 300 mm wafers. In order to prevent such damage from occurring, the probe station 100 may use touchdown sensing mechanisms that are capable of sensing when the probes 256 have made sufficient contact with the conductive path indicia to conduct the necessary testing or probing. This type of touchdown sensing can be achieved by mechanical means or by electronic means. One type of mechanical touchdown sensing mechanism that may be used is disclosed in U.S. Pat. No. 4,956,923, issued to Pettingell on Sep. 18, 1990, which is hereby incorporated herein by reference in its entirety. According to this touchdown sensing mechanism, when the probe tip is lowered into engagement with the target circuitry 118, a contact block is moved out of engagement with a lower terminal or screw causing the normally closed set of contacts to open, and eventually moving the contact block into engagement with another contact causing the normally open set of contacts to be closed. This touchdown sensing mechanism also serves as a force control which allows the force with which the probe point touches the DUT 118 to be adjusted to either require less force for sensing or require more force for sensing depending on what type of sensitivity is desired for a particular application. In another form, the touchdown sensing mechanism of probe station 100 may use an electrical signal sensing mechanism. Moreover, the contact sensing module may be configured such that it is a stand-alone device, or may be integrated into the control systems of system 100. In addition, the contact sensing module may be setup so that touchdown is achieved via a fully automated process, a fully manual process, or a combination of the two.

The form of electrical touchdown sensing described above is a combination of automated processes and manual processes in that it allows the module 460 to automatically detect the initial touchdown of the probes 256*a*–*d*, and thus relies on the system operator to manually initiate a reset procedure in which the module confirms proper touchdown. In alternate forms of sensing, the manual confirmation step may be done automatically. In yet other forms, the system operator may lower the probes 256*a*–*d* manually until touchdown is detected by receipt of the carrier signal.

Depending on the type of testing needed to be done, the probe station 100 may be setup using a very basic probe consisting of a single conductor with which test signals can be applied or acquired, while in other applications, the probe may consist of a more complex probe, such as the low current/low voltage triaxial probes discussed above, or high frequency probes capable of applying and acquiring high frequency test signals. In other instances the probe station 100 may be setup using probe cards and their respective probe card holders or adapters. For example, the probe station 100 may be setup to use a fixed probe card and a fixed probe card adapter to conduct a final wafer test on an integrated circuit prior to the circuit being packaged. Typically, the fixed probe card includes a card made of ceramic or fiberglass, which defines an opening (usually in the center of the card), and has a plurality of probes positioned around, and extending into, the opening so that the probes will make contact with bonding pads located about the perimeter of each integrated circuit die located on the wafer. The fixed probe card is placed in an adapter or holder which positions the probe card over the DUT. Typically the probe card adapter features easy load and unload controls, planarization adjustment controls, and theta adjustment controls, for making setup and use as easy as possible. Once positioned, the plurality of probes extending from the probe card are used to acquire and apply various test signals to the bonding pads located on the wafer or DUT so that the device can be checked prior to being broken out and packaged. Typically, the testing of the DUT will involve a full diagnostic check to make sure the circuit will operate as it is suppose to once it is packaged.

The components of the system 100 may be moved about and operated in a variety of fashions. In a preferred form, the system 100 includes motion control mechanisms 540 (FIGS. 1G, 3A–C, 4A–B, 5A–B and 6) which may include X, Y and Z drives, as well as tilt/tip mechanisms 542. The control mechanisms 540 and 542 shown in FIGS. 1G, 3A–C, 4A–B, 5A–B and 6, allow the DUT 118 to be moved about below the platen 258 so that the probes 256 can reach, and the microscope 104 can view, the various conductive path indicia of the DUT. Similar to the motor control mechanisms discussed above with respect to probe assemblies 106, mechanisms 540 include motor driven screw drives which are used to move the platform 544 and/or the carrier 250 about below the microscopes 104 and/or 105 thereby simulating microscope movement 104 over the DUT 118.

The platform 544 is generally rectangular in shape and is operably connected to the carrier 250 via the Theta, X and Y drive stages 311, 312 and 314, and to the platen 258 via Z drive members 316 which extend upward from the platform 544 to the platen 258. More particularly, the platform 544 is designed as a base or stage to which the X, Y and Z drives 312, 314 and 316, the theta drive 311, the carrier 250, platen 258 and probe assemblies 106 are supported or connected.

Figure 4A:
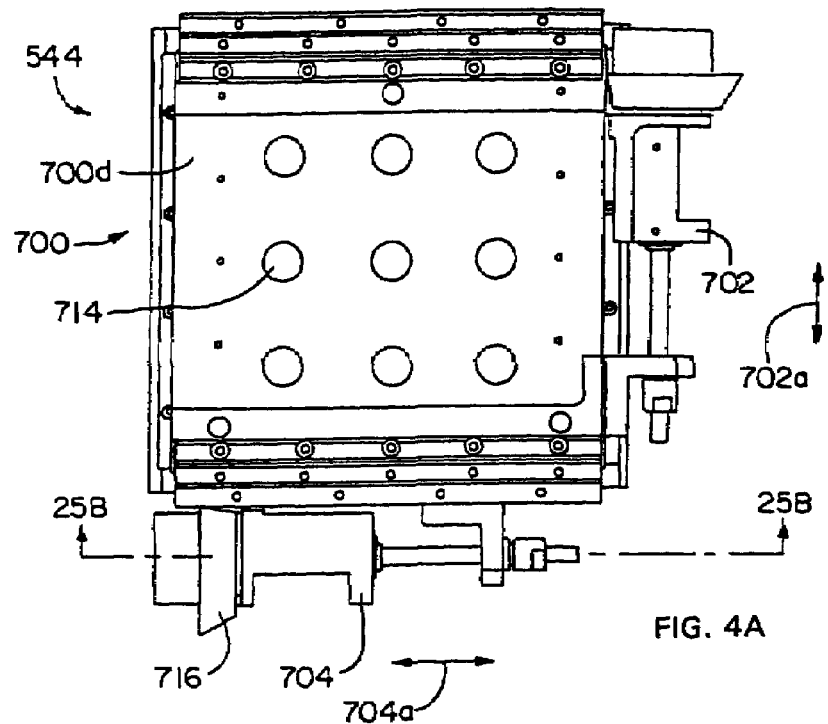
FIGS. 4A–B are plan and side elevational views, shown in partial cross section, of the X and Y stages for the system platform (the platform or microscope stages)
Figure 4B:
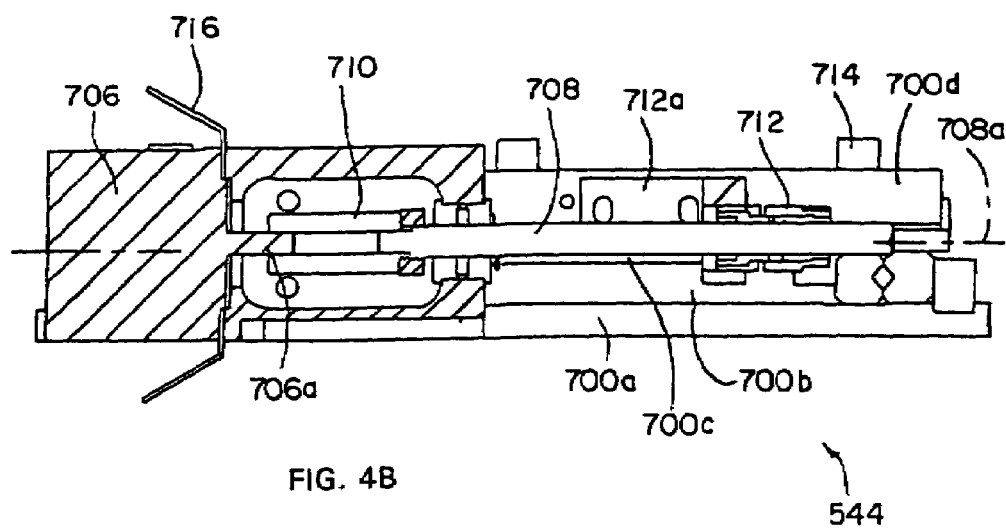

As shown in FIGS. 4A–B, the platform 544 can be driven in the X and Y direction via motor and screw drive assemblies 702 and 704, respectively. Operation of the X axis stage drive 702 moves the bed 700 of the platform in the X-direction indicated by arrows 702*a*. Operation of the Y axis stage drive 704 moves the bed 700 in the Y-direction indicated by arrows 704*a*. This movement is achieved by using the motor to rotate a lead screw to a nut attached to the bed 700 and threaded onto the screw. Rotation of the motor in one direction causes the lead screw to move the nut, along with the bed 700 attached thereto, towards the motor. Rotation of the motor in the other direction will cause the lead screw to move the nut and bed 700 in a direction away from the motor. This configuration allows for movement of the carrier 250, manipulators 252*a*–*d*, and probes 256 by simply moving the platform 544, and allows the microscope 104 to remain primarily stationary which, as discussed above, is advantageous due to the expense, size, and difficulty in moving the microscope 104.

In FIG. 4B, which is a cross sectional view taken along line A—A in FIG. 4A, the Y axis stage drive 704 is shown having motor 706 connected to lead screw 708 via coupling 710. Nut 712, which is connected to bed 700 via mounting bracket 712*a* is threaded onto the screw 708. The bed 700 has a lower guide member 700*a* upon which an upper slide member 700*b* is shifted. The mounting bracket 712*a* connects the nut 712 to upper member 700*b* so that linear movement of the nut 712 along the rotating screw 708 will shift the upper member 700*b* along the screw axis 708*a* extending in the Y-direction. As motor 706 rotates its output shaft 706*a*, lead screw 708 is rotated causing the nut to travel along the screw 708 either closer to, or farther from, motor 706.

In the present high resolution probing station 100, the vacuum chamber 190 is desired for the preferred scanning electron microscope 104 to minimize interference with the electron beam it generates for obtaining high resolution images of the DUT 118. With the low vacuum pressures, however, thermal expansion of the materials of the components employed in the chamber 190 is exacerbated due to the substantial absence of a heat conducting medium, e.g., atmospheric air, for dissipating any heat that may be generated therein. In particular, the aforedescribed drives for the platform stages situated in the vacuum chamber generate heat upon operation of their motors. This heat is conducted to the connected screw drives, which can create imprecision in the movements to be controlled thereby. Further, heat generated by motor operation can radiate to metallic components in the chamber increasing their temperature. Because of the often very small movements that are usually desired in the chamber, any derivation such as due to thermal expansion of the screws, nuts or brackets is to be avoided. Thus, the preferred high resolution probing station 100 has stage drive systems that are well-suited for use in the present vacuum chamber 190 to provide high precision movements of these stages therein.

Preferably the motion control mechanisms and drives of system 100 are constructed of materials having low coefficients of thermal expansion such as ceramic in order to insulate the mechanisms/drives from the heat generated by operation of the motors in the vacuum chamber 190 and particularly to minimize the amount of material growth that is experienced by the positioning equipment due to this heat. In the Y axis stage 704 shown in FIG. 4B, a ceramic coupling 710 is used to keep the heat generated by motor 706 from conducting or transferring to the lead screw 708. This insulates the lead screw 708 from heat conducted thereto by the motor 706 which could cause the screw to expand resulting in unwanted movement of the stage and components attached thereto, (e.g., the platform 544).

In the form illustrated, the lead screw 708 is also constructed of heat insulating material such as jewels like single crystal sapphires or rubies, or ceramics having very low coefficients of thermal expansion. This composition further keeps the heat of the motor from causing thermal expansion in the lead screw 708 and growth thereof and attendant unwanted platform movement due to such thermal expansion. Additional components of the drive mechanism, such as motor mounts, bearings and bearing mounts, nuts, brackets, and the like, can be constructed of similar heat insulating materials in order to further insulate the stage and drive mechanism from heat and unwanted movement.

The drive mechanism of FIG. 4B also has a radiation shield 716 positioned between the heat generating motor and the lead screw 708 and other driven components for deflect the radiated heat or energy created by the operating motor back toward the housing walls, which are better able to handle a buildup of heat due to their exposure to the outer atmosphere. More particularly, the radiation shield 716 is made from stainless steel and forms a ringed collar about the motor which is angled for optimal deflection of the unwanted heat or energy.

As shown in FIGS. 4A–B, the upper slide member 700*b* of bed 700 has standoff columns 714 extending therefrom which are connected to the lower surface of platform 544 and are used to create clearance between the lower surface of the platform 544 and the outer housing of motor 706. Thus, with such a configuration, the platform drive assemblies can be positioned directly below the platform 544 for space conservation in the chamber 190. Once connected, the platform 544 and X and Y stage drive assemblies 702 and 704 allow the system operator to move the carrier 250, manipulators 252*a–d*, and probes 256 by simply moving the platform 544 so that the desired specimen can be quickly positioned below the microscope 104 or 105.

Figure 3A:
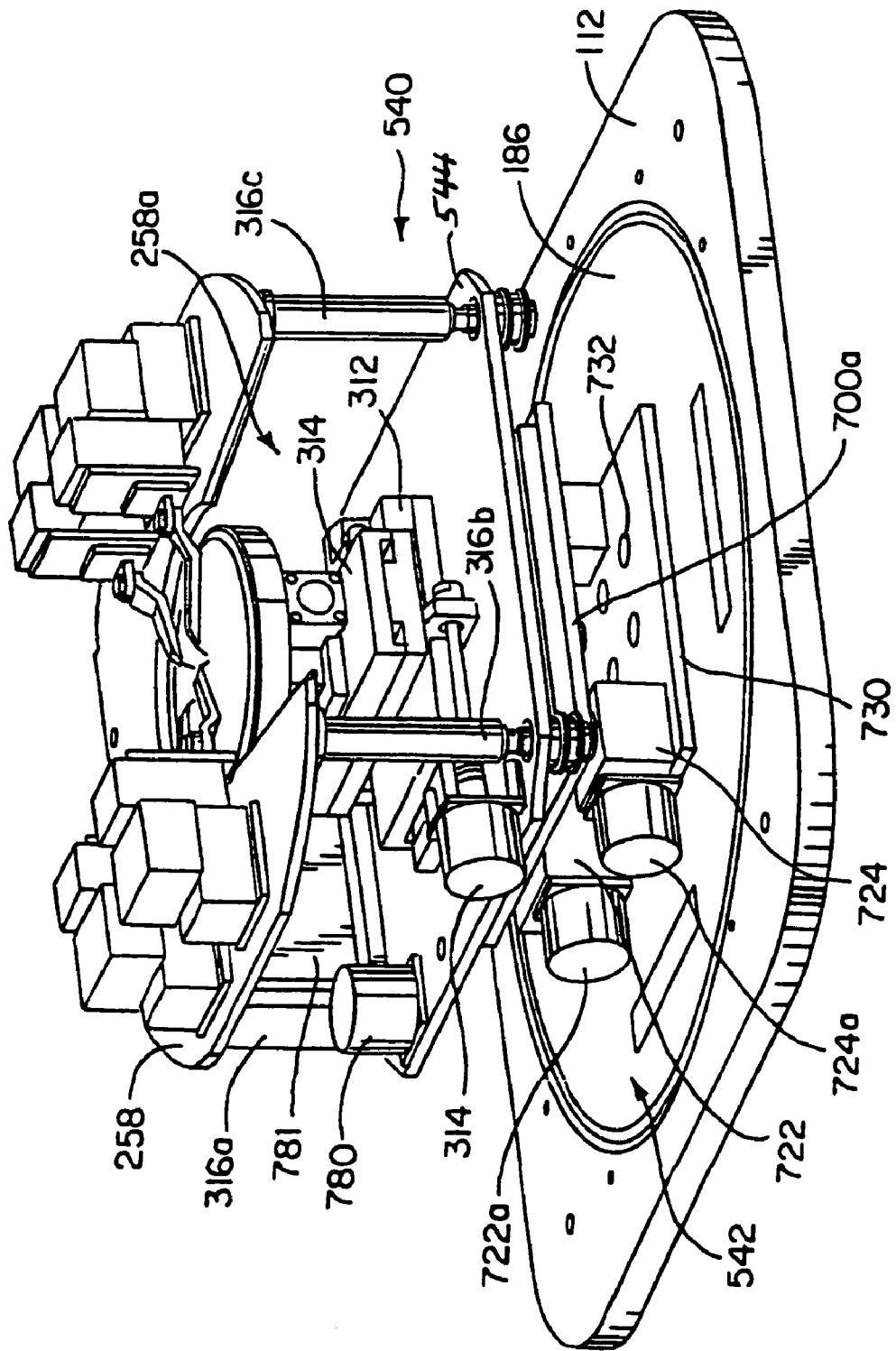
FIGS. 3A–C are perspective, front elevational and right side elevation views of the probe station located within the high resolution analytical probe station housing, showing the housing floor and the tilt/tip mechanisms.
Figure 3B:
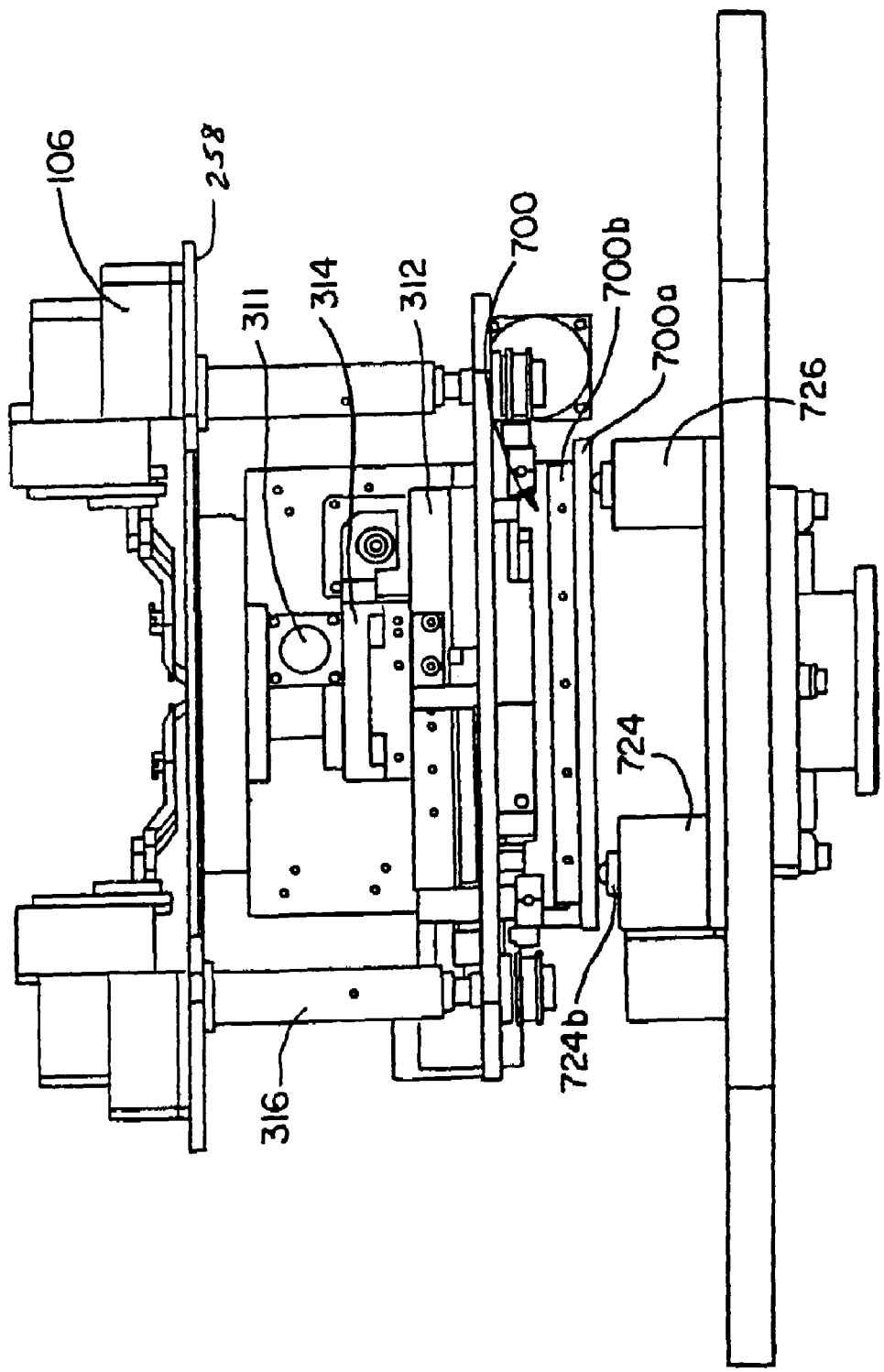
Figure 3C:
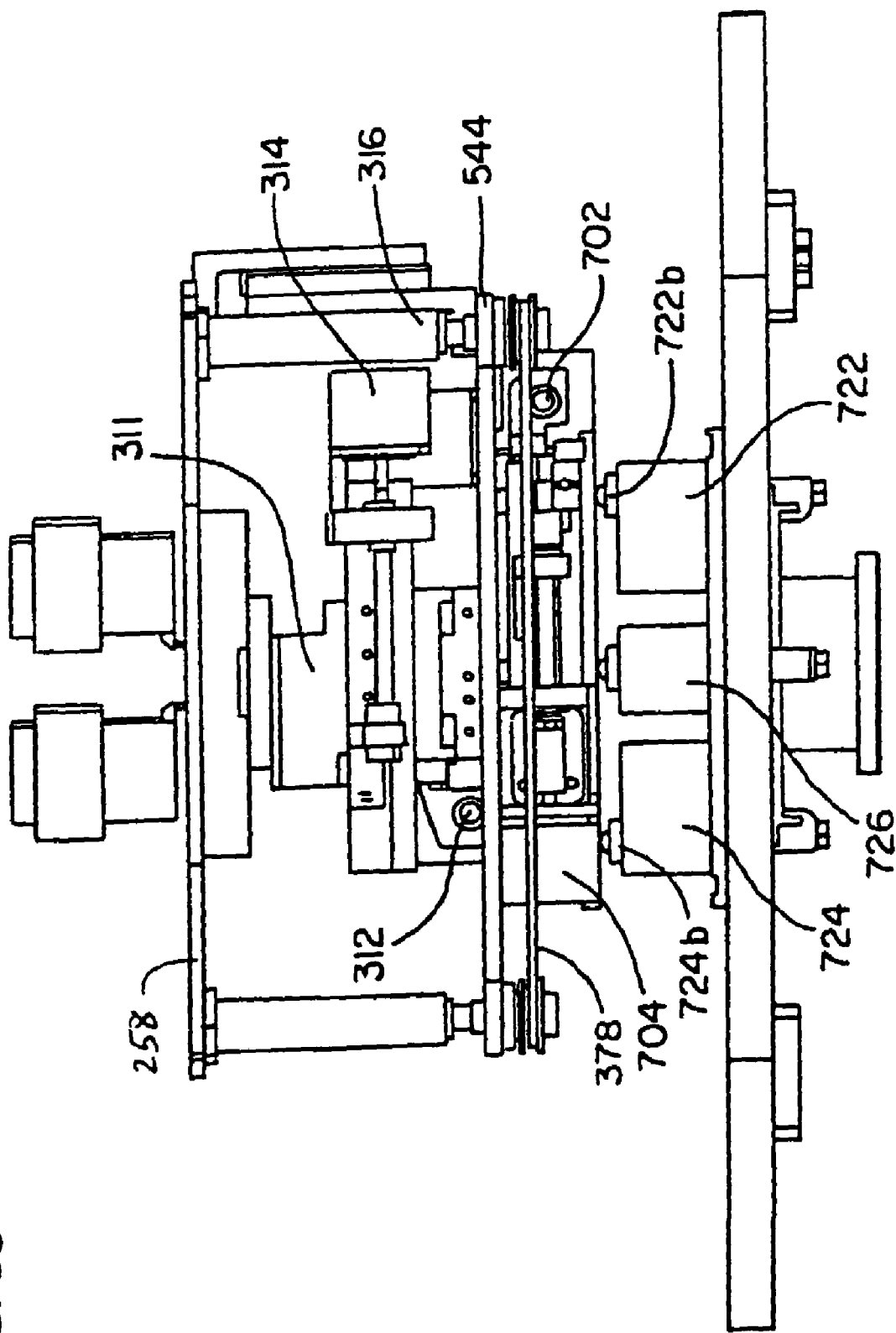

The lower guide member 700*a* of bed 700 is further connected to the tip/tilt control mechanism 542, as best shown in FIGS. 3A–C. This tilt/tip motion control mechanism allows the platform 544, along with the theta drive 311 and X, Y and Z drives 312, 314 and 316, and the platen 258 and probe assemblies 106, to be tilted and/or tipped in desired directions so that optimal views of the DUT 118 or placement of probes 256 may be had.

The tilt/tip motion control mechanisms 542 includes three separate bearing pivots 722, 724 and 726 spaced about the bottom of the housing 102 below the platform 544. In a preferred form, the pivots 722 and 724 have motor driven support bars 722*b* and 724*b* for raising or lowering their respective lower guide member portions independent of one another. The third pivot, pivot 726, is a fixed pivot or gimble which is not capable of raising and/or lowering its respective lower guide member portion. Since pivots 722 and 724 are motorized, pivot 726 does not need to be motorized in order to tilt/tip the platform 544 and its connected components in the desired manner. For example, if a system operator desires to tilt the platform 544 shown in FIG. 3B down to the left, the operator need only lower the support bars of the pivots 722 and 724. Alternatively, if the system operator desires to tilt the platform 544 down to the right, they would raise the support bars of the pivots 722 and 724 until the desired amount of tilting has been reached. The pivots 722, 724 and 726 are positioned in triangular manner so that any desired tilting/tipping can be achieved. With such a configuration, any two pivots can form an axis about which tilting or tipping can be performed. The selected operator of motors 722*a* and 724*a* determine about which axis the platform 544 will be tilted.

In order to provide the maximum amount of tilting, the support bars of pivots 722 and 724 are preferably at mid travel when the platform 544 is parallel to the floor or base walls 112 and 186 of housing 102. With such a configuration, the platform 544 can be tilted up or down in equal amounts by pivots 722 and 724. The support bars preferably have rounded end portions for connecting to the lower guide member 700*a* in a ball and socket type fashion for smooth pivoting engagement therebetween.

The pivots 722, 724 and 726 are mounted to a lower support plate 730 which in turn is mounted to the floor of housing 102. Given the lower support plate's proximity to the floor of the housing 102, and the vacuum pump openings 142 located therein, a preferred form of the lower support plate 730 includes openings 732 which correspond to pump openings 142 and assist air flow in chamber 190 and minimize the amount of time it takes for vacuum 115 to pump air out of chamber 190. The lower support plate 730 is preferably of such a height to provide clearance for the pivot motors 722a and 724a from the floor of the housing 102.

In alternate forms of system 100, the lower guide member 700a may be connected to an upper support plate for the tilt/tip mechanism 542 in order to provide additional clearance for motors and/or in order to provide a more compartmentalized system 100. For example, an alternate form of system 100 is shown in FIG. 1G in which tilt/tip mechanisms 542 have been removed to reduce the size of housing 102 and system 100.

Figure 5A:
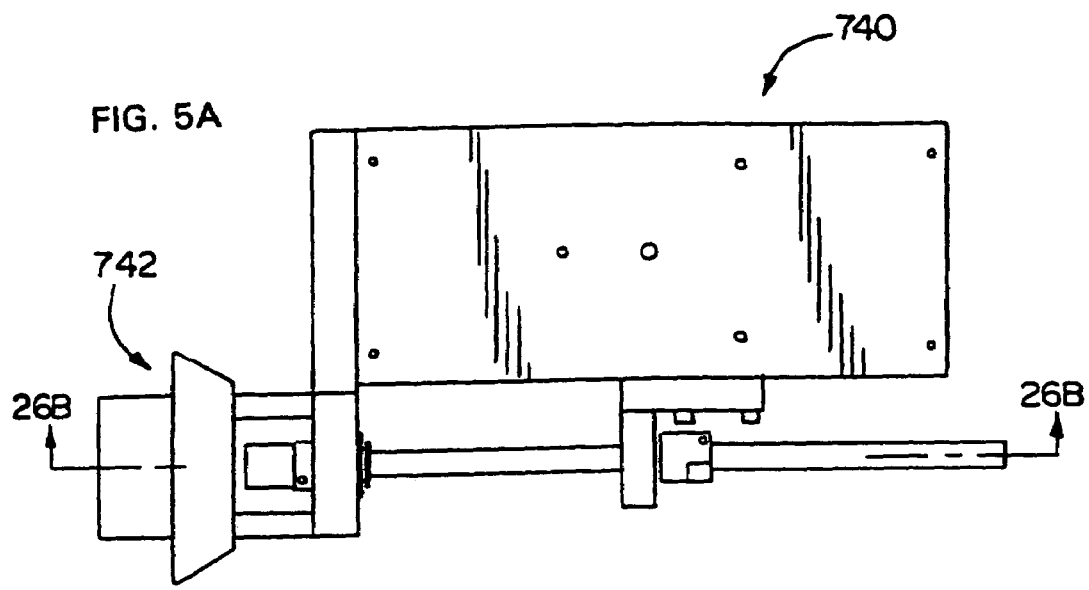
FIGS. 5A–B are plan and side elevation views, shown in partial cross section, of the X stage used for translating the carrier in the X direction.
Figure 5B:
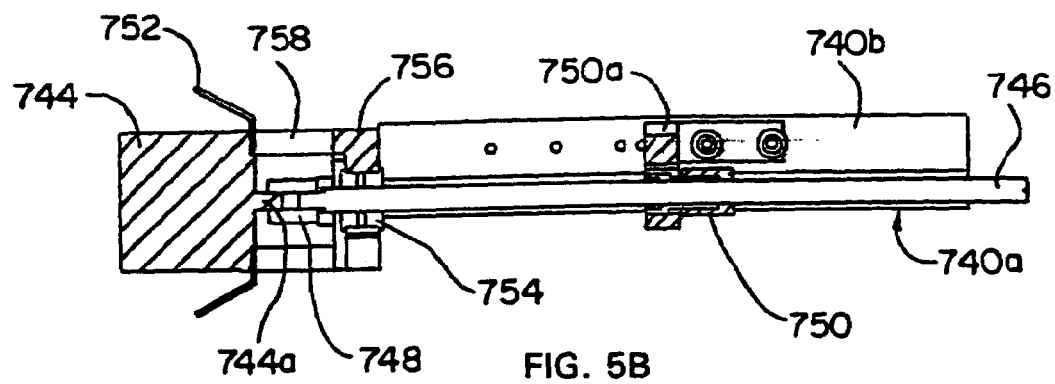

Positioned atop the platform 544 is the X drive (or stage) 312, which may be used to move the carrier 250 along its X axis. Movement of this stage 312 also results in movement of the Y stage 314 and the theta drive 311 carried thereby. As shown in FIGS. 5A–B, the X drive 312 is similar in construction to the platform drive or stage discussed above (e.g., X and Y drives 702 and 704). The X drive 312 has a stage (or bed) 740 upon which the Y drive 314 is mounted, and has a drive mechanism 742 for translating the stage 740 back and forth along the X axis. The stage 740 is comprised of a lower guide member 740a upon which an upper slide member 740b travels. The drive mechanism 742 consists of a motor 744 connected to lead screw 746 via coupling 748. Operation of the motor 744 rotates its output shaft 744a, which rotates coupling 748 and lead screw 746. Rotation of the lead screw 746 causes nut 750 to travel along the screw shift closer to or farther from motor 744. The nut 750 is connected to the upper slide member 740b via nut mounting bracket 750a. When the lead screw 746 is rotated in one direction the nut 750 is moved toward the motor 744 thereby causing the upper slide member 740b of x-stage 740 to travel in the same direction and parallel to the lead screw 746. When the lead screw is rotated in the opposite direction, the nut 750 is moved away from the motor 744 thereby causing the upper slide member 740b to travel in the same direction as the nut and parallel to the lead screw 746.

In order to reduce or minimize the effect heat has on the X drive 312, the drive has been constructed similar to the platform drives 702 and 704 discussed above. More particularly, radiator shield 752 is connected to motor 744 in order to block or hinder the amount of heat or infrared energy generated by motor 744 from radiating to other portions of the drive mechanism 742 and system 100. In a preferred form, the shield is angled at its radially outer positions back toward the housing side wall 188. In this way, radiation is directed generated by heating of the motor 744 operating in the vacuum chamber 190 to the side wall 188. The side wall 188 has a great mass of metal material relative to other system components in the housing 102 to better absorb and conduct heat throughout its entire extent. Further, heat from the side wall 188 can be conducted to outer side wall 114 which can dissipate external heat to the atmosphere.

To further assist in reducing or minimizing the effects of heat on system 100, and particularly on drive mechanism 742, the lead screw 746 is connected to the motor output shaft 744a via a ceramic coupling 748. This removes the metal-to-metal contact between screw 746 and shaft 744a and hinders the heat transfer from the motor 744 to the screw 746. To further reduce heat transfer and its effects on the motion control mechanism 312, the screw 746 may be made from an insulating material such as a jewel like ruby or sapphire, or a ceramic or other insulative material.

The bearing 754 used with screw 746 may also be made of an insulative material in order to minimize the effect heat has on drive 742. Likewise, bearing mount 756 and motor mount standoff 758 may also be constructed of such insulative materials. The use of such materials for drive assembly 742 minimize unwanted shifting of the drive components affecting their precision movements of the carrier 250. The low coefficient of thermal expansion of ceramic ensures minimum of thermal expansion of these drive components. Although ceramic motor mount standoff 758, bearing mount 756 and bearing 754 were not mentioned above with respect to the platform drive systems, such features can also be utilized in these drive assemblies to achieve a similar beneficial result.

Coupled to the X-stage 312 is Y-stage 314, which rests atop the X-stage and allows the carrier 250 to be translated back and forth in the Y direction or axis. Movement of this stage also results in the movement of theta drive 311. As can best be seen in FIG. 3A, the Y stage 314 is very similar in construction to the X-stage 312 discussed above, however, the Y-stage 314 is mounted such that movement of the carrier 250 is in a direction perpendicular to that of the direction traveled by the X-stage 312. The Y stage 314 has a drive mechanism 760 which consists of a motor operated screw drive identical to that of the X stage drive mechanism 742. Heat protection similar to that mentioned above with respect to the X stage 312 can be implemented in the Y-stage 314 and is present in a preferred form of the high resolution vacuum probing 100 herein.

In order to make system 100 more effective for probing large specimen such as 300 mm wafers, the X and Y stages 312 and 314 may be designed with enlarged beds or stages or support structures in order to minimize the amount of Y-stage 312 overhang from the X-stage 312. This prevents deflection that can occur if too large of an overhang is created which results in shifting of the carrier 250 and specimen falling out of focus. For example, if system 100 is being used to view/probe a large specimen and the Y stage 314 is translated to an extreme end in the Y direction, the combined weight of the carrier 250, theta drive 311 and specimen 118 may be enough to cause the Y-stage to deflect down at the end furthest from the X-stage 312 creating enough movement in the testing surface to place the specimen out of focus with the microscope 104 or 105. In order to avoid this, the width of the X-stage 312 is preferably increased to accommodate the full extent of y-axis movement thereby avoiding overhang, and/or additional support structures may be added off to the side of the X-stage 312 in order to provide support to the Y-stage 314. An example of the latter would be to configure the nut and nut mounting bracket shown in FIG. 3A so that it also serves as support for the Y stage 314 when translated out beyond the side of the X stage.

Figure 6:
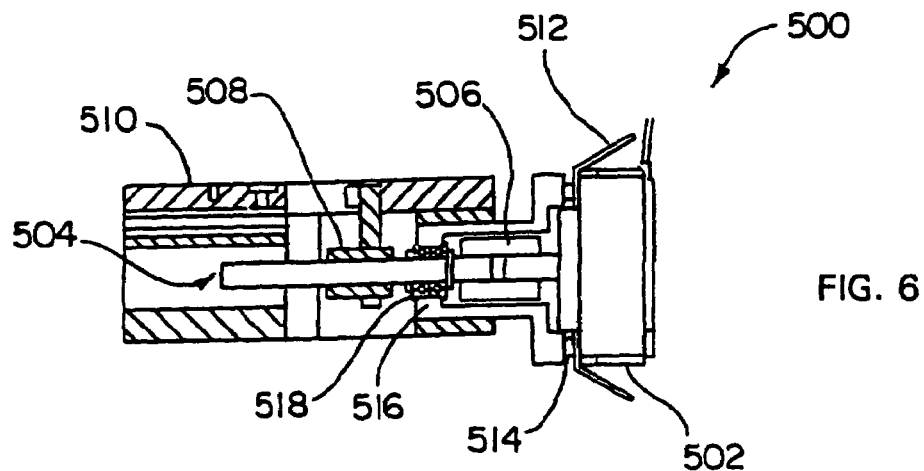
FIG. 6 is a side elevational view, shown in partial cross section, of a stage drive mechanism for a manipulator.

Before discussing the Z stage 316, it should be noted that the concepts of the motion control mechanisms discussed thus far are generally applicable to any of the motion control mechanisms of system 100, such as those used in conjunction with the manipulators 252a–d. For example, an adjustment mechanism for any of the X, Y and Z stages of manipulators 252a–d is shown in FIG. 6. According to this illustration, the adjustment mechanism (which is referred to generally by reference numeral 500) includes a motor 502 which is coupled to isolated lead screw 504 via insulative shaft coupling 506. As discussed previously any insulator may be used for coupling 506 so long as it contains the desirable thermal properties, e.g., low coefficient of thermal expansion, for handling the heat generated and/or radiated within chamber 190. When the screw 504 is rotated in a first direction, the nut 508 is moved farther away from the motor 502 causing motion plate 510 which is attached to nut 508 to also move away from motor 502 in the direction defined by the axis of screw 504. When the screw 504 is rotated in the opposite (or second) direction, the nut 508 and motion plate 510 are moved closer to the motor 502.

The manipulator adjustment mechanism 500 may also utilize the thermal protection concepts discussed above with respect to other motion control mechanisms. For example, in FIG. 6, radiator shield 512 is used to deflect and/or hinder radiation of heat/energy from motor 502. The motor 502 is also isolated from the remainder of the drive mechanism 500 by isolating spacers 514. In addition, a thermal bearing insulator 516 is used to isolate bearing 518 from the rest of the mechanism 500. Alternatively, in other forms of system 100, a ceramic bearing may be used with the adjustment mechanism 500.

Turning now to FIGS. 3A–C, the Z stage 316 preferably includes four column shaped members 316a, b, c and d that have screw drives for raising and lowering the platen 258 with respect to platform 544 therebelow. More particularly, each column 316a–d has a sprocket 770 which is located below the platform 544 and is connected to a lead screw 772. The lead screw 772 passes through an opening in the platform 544 and supported by bearing 774 thereunder. A nut 776 is threaded onto the screw 772 and connected to the sleeve portion that makes up the majority of column shaped members 316a–d. When the motor operates to rotate sprocket 770 and lead screw 772, the nut 776 and its attached sleeve or column are moved closer to or farther from the sprocket 770. For example, when the sprocket 770 and lead screw 772 are rotated in one direction, the nut 776 and sleeve are moved away from the sprocket thereby raising the platen 258. When the sprocket 770 and screw 772 are rotated in the opposite direction, the nut 776 and sleeve are moved closer to the sprocket thereby lowering the platen 258. Thus, the Z drive 316 operates to raise and lower the platen in the Z direction or axis.

The sprockets of the column members 316a–d are connected to one another via a driven member such as a belt or chain 778 (FIG. 3C). The driven member 778 is connect to, and driven by, the single motor 780 which can best be seen in FIG. 3A. In this way, only one motor is needed to operate the Z drive 316, and each column member 316a–d will raise or lower the platen 258 simultaneously in equal amounts. In alternate forms of system 100, however, each column 316a–d could be configured having its own motor or drive mechanism and with each column member being operable independent of the others. With such a configuration, the Z drive 316 could be used not only to raise and lower the platen in the Z direction, but also to perform tilt/tip functions similar to those discussed above with respect to tilt/tip drive mechanisms 542.

A Z-shape guide and slide 781 is positioned near the back of the chamber 190 and is attached to the platform 544. This guide/slide 781 is similar in construction to the guide and slides discussed with respect to X and Y drives 312 and 314 and operates to guide the Z drive mechanisms 316a–d in a straight up and down (or vertical) manner to ensure that no lateral movements are made which might affect the positioning of the DUT 118.

The motion control mechanisms of system 100 may be operated and configured in a variety of ways in order to provide any number of desired movements. For example, the platform 544 may be used for coarse adjustments of the carrier 250 and DUT 118, while more precise (or fine) adjustments may be made via the X, Y, and Z stages 312, 314 and 316 of the carrier 250. The motion control mechanisms 540 of platform 544 may be used to generally position the desired portion of the DUT 118 and carrier 250 under the microscope 104 or 105, (e.g., general X and Y positioning), while the X, Y and Z stages 312, 314 and 316 of carrier 250 may be used to actually position the probes 256 on the desired conductive path indicia of the DUT 118, (e.g., fine X, Y and Z positioning).

The fine positioning of the DUT and carrier typically involves using the X and Y stages 312 and 314 of chuck 260 to position the DUT 118 in the appropriate X and Y positions and then using the Z stage 316 to raise the DUT 118 into contact with the probes 256 and/or lower the probes 256 into contact with DUT 118 via the Z position adjustment mechanism 358 or 374 of manipulators 252a–d.

In alternate forms of probe station 100, the probes 256 may be capable of positioning themselves, (e.g., probes with internal motor driven joints), however, such a configuration is less desirable than the configurations discussed above because it introduces additional noise making components, which are very near to the probes 256, thereby increasing the risk of noise or other interference affecting the acquired and applied test signals. As with the X, Y and Z stages 312, 314 and 316, the screw drive motion control mechanisms 540 may use a variety of types of motors, such as linear motors, stepper motors, servo-motors, or the like, as long as they are capable of providing the desired translation of the platform 544 (including platen 258, carrier 250, manipulators 252a–d, probes 256).

As mentioned above, the tilt/tip mechanisms 542 also position the DUT 118 under the probes 256 and microscope 104. For example, these mechanisms 542 may be used to position probes 256 on the DUT in a desired fashion, to assist the user in "seeing" probe-touchdown on the DUT, or simply to allow the user to observe the probes 256 making contact with the DUT 118 from an angle other than vertical.

The probe station 100 may also be setup with environmental controls which operate to control the temperature and atmosphere within the housing 102. Such controls may be used to conduct "at temperature" testing or to obtain specified atmospheric conditions in order to more accurately test how a DUT 118 will operate in its actual application environment. The environmental controls may also be used to minimize the effect any of the components within housing 102 may have on the probing/testing of the DUT 118. For example, a temperature control system consisting of a network of fluid carrying tubes may be used to cool down the temperature within housing 102 and/or various components therein to reduce the effects of thermal expansion.

In a preferred form of probe station 100, the tubes carry a coolant, such as cold water, throughout the inner chambers 108 and 182 in order to cool down the probe station 100. The tubes rely on heat transfer principals to remove unwanted or excessive heat generated by the motion control mechanisms 540, stages 312, 314, 316, manipulators 252a–d, and carrier 250. Such a system is particularly desired in vacuum environments because vacuum environments are excellent thermal insulators in that there is nowhere for the heat generated by the system to go. This built-up heat can have deleterious effects on the probe station and/or its components. For example, the probe station 100 may be setup using a thermal chuck 260 which is used to test a wafer 118 at temperatures slightly above ambient temperatures. While testing the wafer 118 at temperature, the motors used to move the chuck 260, the manipulators 252a–d, the platform 544 may begin to generate heat due to their use. Without a temperature control, this motor-generated heat may raise the temperature inside housing 102 to a level above that which the wafer 118 was to be tested at and may cause inaccurate readings to be taken when conducting the probing of the specimen 118. However, by providing a temperature control system, the motor-generated heat may be accounted for and removed from the probe station 100 so that the wafer 118 can be tested at the appropriate temperature. Another negative effect of component-generated heat is that it can affect the operation of the probe station equipment. For example, excessive temperature within housing 102 has been shown to cause the probes 256 to vibrate or wobble. Such motion in the probes 256 not only makes it more difficult to operate the probe station 100 because of difficulties in placing the probes 256, but also may prevent the probe station 100 from being used to probe various specimens 118 such as very small wafers having minute conductive path indicia because any type of vibration may make it impossible to position and maintain the probes 256 on the desired indicia.

The temperature control system also allows the probe station 100 to maintain a desired temperature within housing 102 by accounting for the fact that components, other than those specifically meant to supply heat such as a thermal chuck 260, may end up generating heat over time themselves. Additional lines carrying fluid about the carrier 250, manipulators 252*a*–*d*, probes 256 and motion control components may be employed to control the temperature of each device and/or assist in controlling the temperature within housing 102.

Given the various types of testing that may be performed and various types of carriers 250, manipulators 252*a*–*d*, and probes 256 that may be used by probe station 100, it is foreseeable that these components may be swapped in and out of the probe station 100 quite frequently. As such, the probe station 100 may equip the components and/or the leads connecting the components in such a way that they can be quickly and easily removed and re-installed. For example, the electrical leads 120 that run to each device may include detachable interconnections located proximate to the device so that the operator does not need to spend time installing, uninstalling and/or reinstalling corresponding leads 120 every time he or she wishes to swap in and/or out a device. The detachable interconnections may be located at a variety of positions about the leads and lines. Furthermore, the components of the probe station 100, such as the carriers 250, manipulators 252*a*–*d*, probes 256, etc., may contain lead connections or ports that allow for quick and easy installation, removal, and/or reinstallation of the leads 120 connected to that component. In a preferred form, detachable interconnections are located on the leads 120 proximate to the carrier 250, manipulators 252*a*–*d*, and probes 256, as well as proximate to the feedthroughs 138 and 140, and proximate to the controllers used to operate the probe station 100. Ideally the carrier 250, manipulators 252*a*–*d*, and probes 256 contain lead connections or ports which further allow for quick and easy installation, removal, and/or reinstallation of the leads 120.

Figure 7:
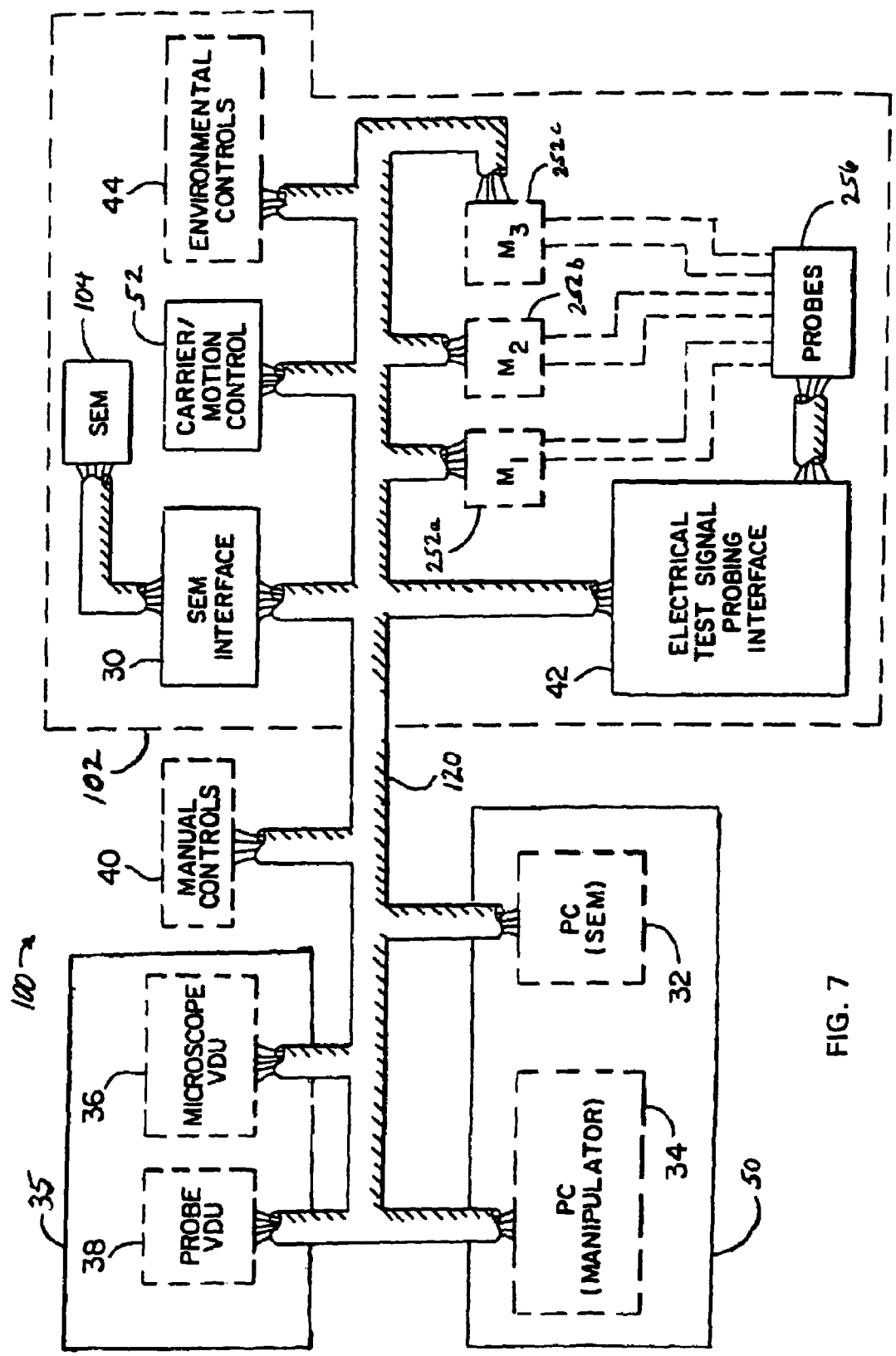
FIG. 7 is a block diagram of a high resolution probe station programmed in accordance with the present invention to maintain accurate positioning between a probe and the DUT.

While the above description of probe station 100 discussed the basic structure of the probe station 100, including its housing 102, high resolution microscope 104 and probe assembly 106, the following will discuss the setup and operation of the probe station 100 and provide additional details regarding the software used to operate the probe station and to account for unwanted movement or drift of the component therein. As illustrated in FIG. 7, the probe station 100 is connected to a controller 50, (e.g., a microcontroller or other processor such as a microprocessor, a network of processors, a programmable logic controller (PLC) or other electronic controller, a gate array, or the like), which operates, monitors, and collects data from the probe station 100. In the embodiment illustrated in FIG. 7, the controller 50 consists of a personal computer having a display, such as monitor 35, with video imaging capabilities.

The controller 50 is connected to the various components of the probe station 100 via leads (or lines) 120 passing through feedthroughs 138 and 140. As mentioned above, feedthroughs 138 and 140 allow vacuum tight seals to be made with the housing so that the housing portions 108 and 182 can be pulled into a vacuum state. The leads/lines 120 may consist of wire, cable such as a computer bus, piping or conduit for such things as wire, vacuum lines, air lines, and/or environmental controls 44 such as the fluid carrying tubes discussed above.

More particularly, the controller 50 is connected to microscope 104 via a microscope interface 30, which allows the system user to view the specimen 118 on the display 35 and conduct non-contact probing via Electron Beam Induced Current (EBIC) or Optical Beam Induced Current (OBIC) analysis. An electrical test signal/probing interface 42 connects the controller 50 to probes 256 so that test signals may be applied to or acquired from the specimen 118. If the system 100 is setup with a probe card carrier 250, the specimen 118 is positioned in contact with the probes 256 of probe card carrier 250 via carrier/motion controls 52 (e.g., control mechanisms 540 including tilt/tip mechanism 542, theta drive 311, carrier X, Y and Z drives 312, 314 and 316, platform X and Y stages 702 and 704, and the like). If the system 100 is setup with individual probes 256 and manipulators 252*a*–*d*, the specimen may be positioned in contact with the probes 256 via movements of the manipulators 252*a*–*d* and/or the carrier/motion controls 52. In one form of the apparatus 100, one computer 32 will be configured as a digital image processor for acquiring the images from the SEM 104, and another computer 34 will be configured for remotely controlling the plurality of probe assemblies 106 via manipulators 252*a*–*d*. Alternatively, these functions may be performed on a single computer or server. Similarly, one display 36 may be used for displaying high resolution microscope images and computer graphics relating to SEM 104, and another display 38 will be used for probe related images and graphics.

Additional leads 120 may be connected from the controller 50 or other supporting equipment, such as air tanks, vacuum pumps, temperature controllers, etc., directly to other portions of the probe station 100. For example, microscope operating leads may be connected directly from the controller 50 and the mains power supply to the microscope 104. In addition, vacuum lines may be connected directly from a vacuum pump to pump passages 142 and 144 of housing 102. In a preferred form, manual controls, such as pendant controller 40, are connected to the probe station 100 to allow the system user to operate the apparatus 100 remote from the computer 50 if desired. In yet other forms, the controller 54 may be connected to other optional equipment such as environmental controls 44 such as the coolant tubes discussed above and manual controls 40 such as a pendant control which will be discussed further below.

The probe station 100 tests the specimen 118 by positioning probes 256, via the controller 50, over various conductive path indicia located on the surface of the specimen 118 and uses the probes 256 to either apply or acquire a variety of test signals to or from the DUT 118. More particularly, the controller 50 operates motion control mechanisms 540 and tilt mechanisms 542 to position the platform 544 and the associated carrier 250 so that probes 256 are generally above the desired conductive path indicia to be probed (or target area). When manipulators 252a–d are used, the controller 50 further operates X and Y position adjustment mechanisms of manipulators 252a–d, and X and Y stages 312 and 314 of probe assemblies 106, to position the probes 256 above the target area. Then the controller raises the carrier 250 via Z stage 312 of probe assembly 106, and/or lowers probes 256 via Z position adjustment mechanism 358 of manipulators 252a–d, until the probes 256 have made sufficient contact with DUT 118 to conduct the desired testing. In a preferred form, the controller is connected to a contact sense module 460 and stops the motion control mechanisms when sufficient probe touchdown has occurred. This prevents the DUT 118 from being inadvertently damaged by probes touching down with excessive force.

The environmental control system 44 monitors and/or controls the environment, including the temperature, humidity, vacuum state, etc., within housing 102 so that it is set at, and remains at, the desired setting for testing the DUT 118. The various parts of the probe station, such as the environmental control system 44, may be controlled by the controller and/or may be controlled at least in part by additional controllers.

Once the probes 256 are positioned and the environment is set, testing is ready to begin. At this point, the probe station 100 begins using the probes 256 to either apply or acquire test signals. Typically, one probe will be used to apply a test signal at a desired point in the circuit of specimen 118, and another probe will be used to acquire the signal resulting from the application of the test signal at another point on the circuit of specimen 118. The probe station 100 may then be used to analyze the acquired signal to determine if it is generally equal to the signal that should have been acquired at that particular point in the circuit of specimen 118. If it is equivalent, that portion of the circuit is presumed to be operating correctly. If the acquired signal is not equivalent to the signal that should have been received at that particular point in the circuit, then the specimen 118 may be further analyzed to determine what is wrong, or may simply be marked as a defective component.

After this target area has been probed, the probe station 100 may locate and begin testing another target area on DUT 118. Depending on the location of the next target area, the probe station 100 may simply need to raise and re-position the probes 256 via manipulators 252a–d to position the probes 256 above the new target area, or the probe station may need to use additional motion control components including manipulators 252a–d, X, Y and Z stages 312, 314 and 316, and motion control mechanisms 540 and tilt mechanisms 542 in order to position the probes 256 above the new target area. For example, if the new target area is very close to the area that was just probed, fewer motion control mechanisms may be needed in order to position the probes over the new target area. However, if the new target area is farther away from the area that was just probed, more or even all of the motion control mechanisms may be needed in order to position the probes over the new target area, (e.g., if the manipulators 252a–d cannot move the probes 256 far enough to reach the new target area, the carrier X, Y and Z stages 312, 314 and 316 may be needed; similarly, if the X, Y and Z stages cannot move the probes 256 far enough, the motion control mechanisms 540 may be needed).

Once the probes have been positioned over the new target area of the DUT 118, the controller 50 (or other actuator control) will raise the carrier 250 via Z stage 312 and/or lower the probes 256 via manipulators 252a–d to move the probes 256 into sufficient contact with DUT 118 to conduct the desired testing. As discussed above, a probe touchdown sensing mechanism may be used to determine when sufficient probe touchdown has been made. Once testing is ready to begin, the controller begins acquiring and/or applying test signals about the target area via the probes and analyzes the test results to determine if the DUT is operating correctly. The probe station 100 may also be setup using a socket stage adapter and socket card, fixed probe card, and/or a test head with which various types of DUTs can be tested. Although the connections and setup for these devices may differ, the general operation of probe station 100 is similar to that discussed above, (e.g., applying probes to target areas, probing and analyzing data, etc.).

The actual control and operation of probe station 100 may be made via traditional input devices associated with the controllers, such as a keyboard, mouse, joystick, touch sensitive screen, switches or the like. The probe station 100 may also be programmed so that the probe station 100 is capable of performing repetitive testing with minimal user input. Additional controls may be provided on the exterior of housing 102 and/or may be provided in a pendant control which is commonly used in the industry and with the products sold by The Micromanipulator Company, Inc.

Figure 8A:
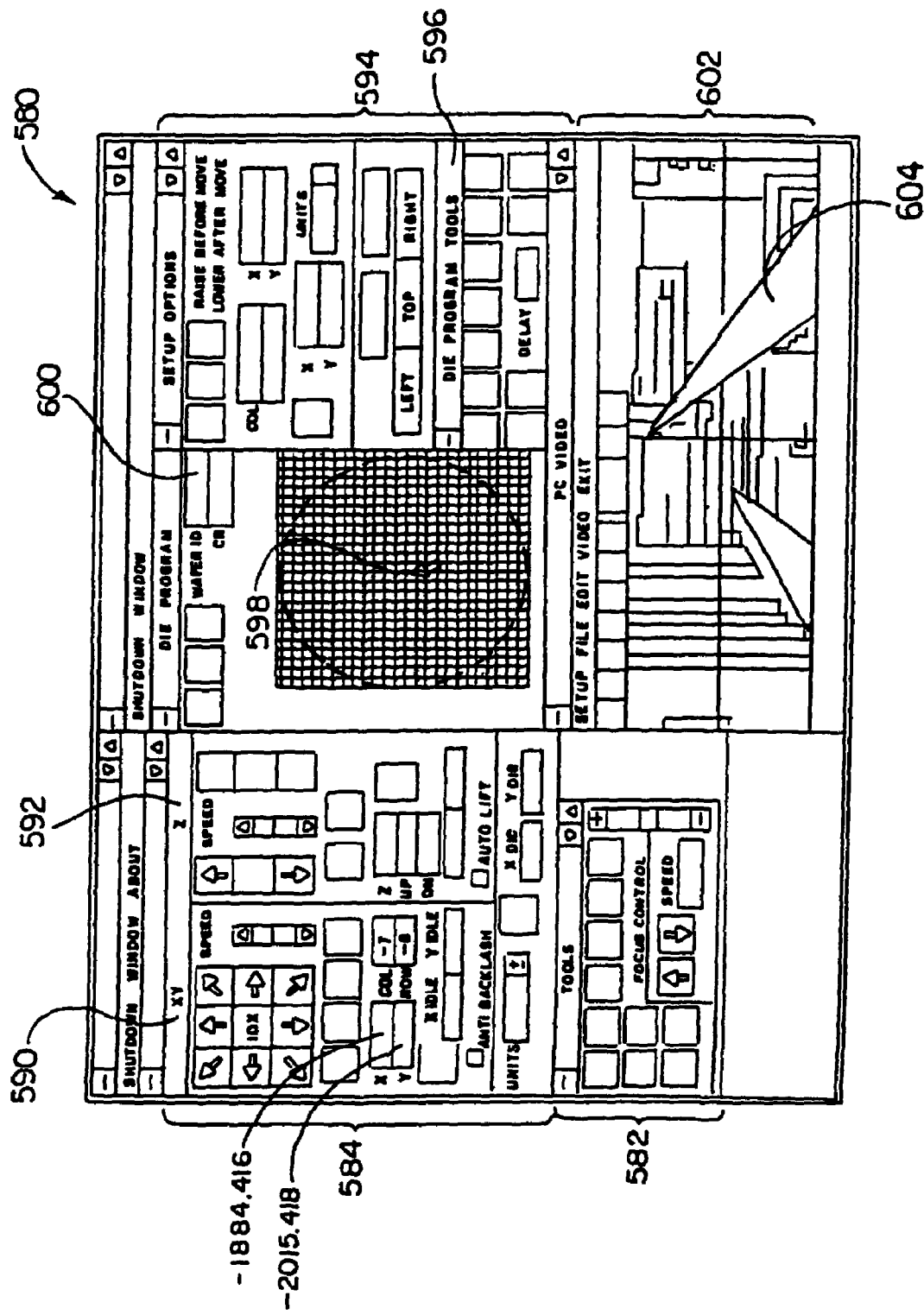
FIGS. 8A–B are views of screen printouts from the probe station software showing video images of the specimen and a wafer profile of the specimen.
Figure 8B:
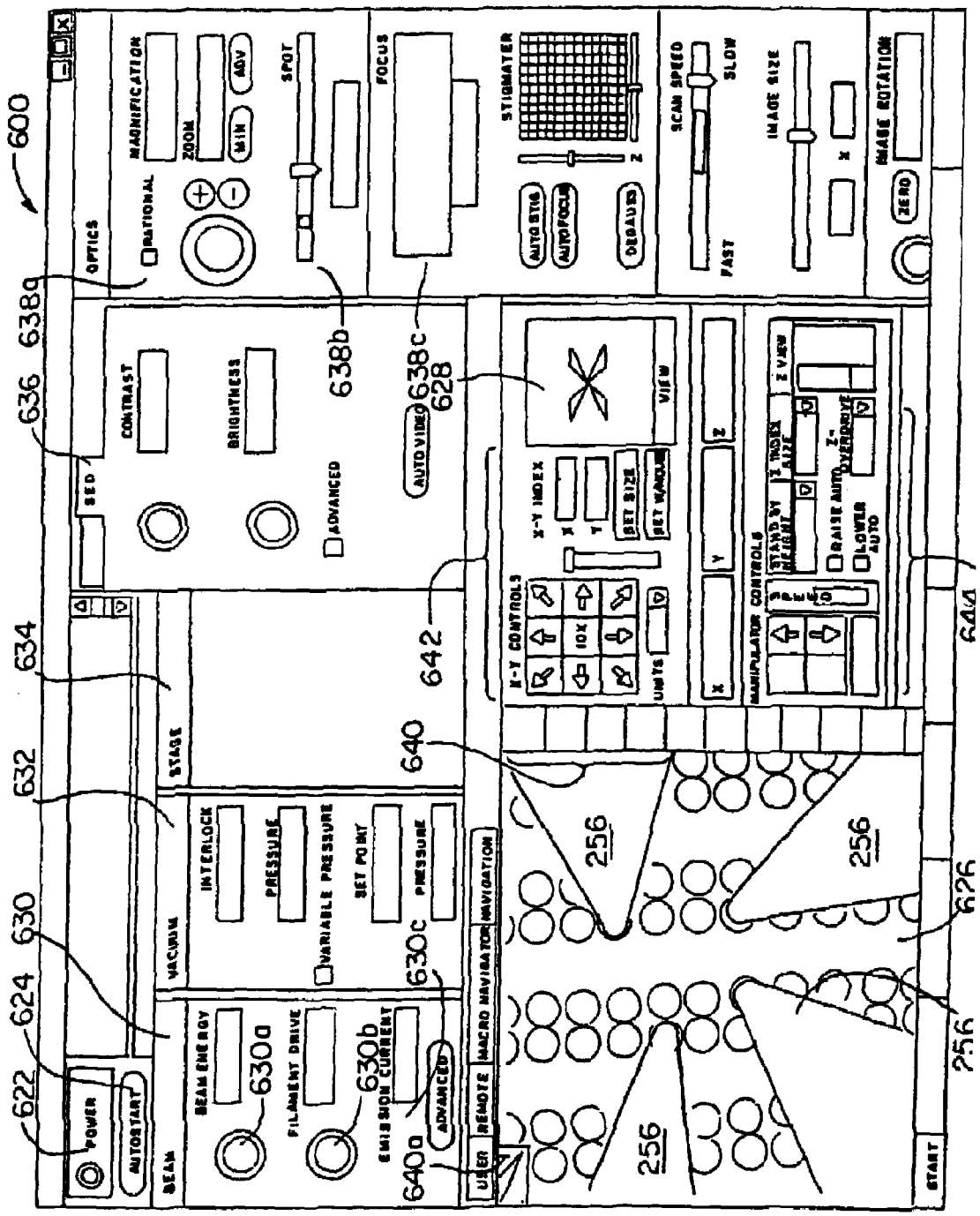

In order to assist the user in probing the DUT 118 and moving the DUT about so that multiple target areas can be probed, the probe station 100 may be setup with the PCPII software. In FIGS. 8A–B screen views of the PCPII software executed by controller 50 are shown as they would appear on a monitor display 35, such as computer monitor. In FIG. 8A, the PCPII software interface 580 allows the probe station user to make remote adjustments to the microscope 104, and manipulators 252a–d and probes 256 via user interface control panels 582 and 584 respectively. For example, the microscope control panel 582 allows the probe station user to adjust the focus of microscope 104 via control 586. In addition, speed may be adjusted by scrolling up or down scroll bar 588 on the control panel 582.

The manipulators 252a–d, and probes 256 can be controlled via control panel 584. For example, speed and direction of travel in the X and Y directions can be adjusted via XY settings 590. Similarly the speed and direction of travel in the Z direction can be adjusted via Z settings 592. The control panel 584 also displays the current position data below the XY settings 590 and Z settings 592, and allows the probe station user to select what units measurements and/or movements are made in.

The PCPII software interface 580 also allows the probe station user to setup and view a wafer profile via control panel 594. For example, when the DUT 118 consists of a wafer, the probe station user can type in the diameter of the wafer and a grid of dies present on the wafer can be generated, (e.g., columns and rows). The probe station user can enter particular features pertaining to the die via the die program tools 596 and can pick which die is to be viewed by the microscope 104 by simply selecting the die with cursor 598.

More particularly, cursor 598 can be used to indicate the respective selected location or test site on the specimen being probed, (e.g., the sites at which test signals are transferred to and from the probe). In this manner, an operator can change selected test locations via on-screen manipulation of the cursor, as by a mouse or other computer interface control. Moving the cursor 598 causes the relative position between the probe 256 and the specimen surface to shift under software control so that the probe 256 is oriented at the selected test site. To this end, the software is programed to operate actuators of the probe assemblies 106 and/or the carrier 250, (e.g., X, Y and Z stages 312–316 and/or the motion control mechanisms 450), on which the specimen is affixed for precision shifting thereof to position the probe 256 at the selected test site. More particularly, the software is used to interpret the cursor movement and determine the precise distance with which the DUT needs to be moved. This analysis may not only require the application of a scaling factor to calculate the horizontal distance that must be traveled, but also may involve determining which actuators are to be used, (e.g., probe assembly actuators, carrier actuators, etc.), in order to accomplish the desired travel in the most efficient manner.

Accordingly, with a mouse, an operator can click and drag the cursor 258 across the screen to the desired conductive path indicia location or terminal they desire to test. This cursor movement can result in a variety of different movements for the probe station 100. For example, the user may click and drag the cursor from one die to another, causing the probes 256 to move from one die to another so that the new die may be probed or analyzed. Alternatively, the user may click and drag the cursor from one probe location to another, causing the selected probe to move from one location on a particular die to another location on that same die. In a preferred form, the operator or user is capable of selecting what type of movement he or she wants via the software prior to making the move. For example, if the user would like to move a single probe from one location to another, he or she would position the cursor 258 over the probe he or she wishes to move, and then would click and hold the mouse input button down and drag the mouse until the cursor 258 is at the desired new test location for that probe. Once the mouse input is released, the software would cause the selected probe to move to its new location. Alternatively, the user could indicate that he or she wishes to switch dies and he or she would position the cursor 258 over the current die, and then click and drag the cursor to the desired die to be probed. Once the mouse input is released, the software would cause the desired die to be placed under the high resolution microscope 104 for probing.

Although a click and drag type input process has been described, alternate input processes may be used so long as the desired movement is achieved. For example, movement from one die to another could be achieved by simply positioning the cursor 258 over the desired die to be tested and clicking or double-clicking the mouse input causing the selected die to be positioned under the high resolution microscope 104. Similarly, probe movement from one location to another on the same die could be achieved by clicking on the desired probe to move, or selecting via a menu which probe is to be moved, moving the cursor 258 over the desired new location for that probe, and then clicking or double-clicking the mouse input at that cursor location causing the selected probe to move to the desired new location.

The wafer profiles and settings entered into the probe station 100 can be saved so that similar DUTs can be probed by simply calling up the stored settings. For example, a wafer ID can be assigned to certain types of wafers and the probe settings and testing procedures for these types of wafers can be recalled by simply entering the assigned wafer ID into the wafer ID field 593. This allows the probe station user to test similar wafers more rapidly and provides a way in which routine probing can be programmed into the probe station 100 so that it can be accurately repeated in the future.

Video images of the probes 256 and DUT 118 may be viewed and/or adjusted via control panel 595. The video images 597 are provided to help the probe station user identify where on the DUT 118 they are at, as well as to assist the user in positioning the probes 256 and in probing the DUT 118. One of the notable features of this control panel 595 is the ability to print images of the DUT 118 via the print icons located in the tool bar of the control panel 595.

The screen view shown in FIG. 8B depicts another form of software interface 620 which may be used to control system 100. In this interface, power to system 100 is turned on/off via power switch 622. The system user can perform an automatic start feature by selecting AutoStart 624 which will start the high resolution microscope 104 imaging. An active image of the probes 256 will be displayed in field 626, and a "bird's eye" view of the probes and specimen will be generated in field 628. The electron beam characteristics can be monitored and controlled view field 630. More particularly, the system user can adjust or monitor the beam's voltage 630a, filament 630b and current 630c via field 630 so that the desired testing can be performed. Similarly, the system user can control the vacuum characteristics and stages of system 100 in fields 632 and 634. The image displayed in field 626 can be automatically adjusted via the brightness and contrast adjustment switches of filed 636, and/or can be manually adjusted by selecting the advance settings box and selecting AutoVideo button. The optical controls of the SEM 104 can also be adjusted by selecting any of the items in the optics field 638. For example, the magnification of the image can be increased or decreased via the control settings 638a. The spot size and focus characteristics can also be adjusted in field 630 at 630b and 630c. Additional settings for the microscope 104 can be adjusted in field 630 including the astigmatism, beam scan rate, image size and image rotation.

According to this interface 600, the system operator moves the desired probe 256 by selecting which probe assembly 106 he or she wants from the icons identified by reference numeral 640. Once selected an icon 640a identifying which assembly has been selected appears in the top left corner of the active image viewing field 626. In the illustration shown in FIG. 8B, manipulator one has been selected. Thus, the manipulator controls and monitoring sections pertain to that of manipulator one. For example, the manipulator X and Y controls 642 displayed in FIG. 22B are currently setup to maneuver manipulator one and to display the positioning data of this same manipulator. Similarly, the manipulator Z controls 644 shown display the pertinent Z data for manipulator one and control the Z drive mechanism for this assembly. Some of the Z controls shown include probe up/down selections, theta speed setting selections, and course adjustment selections for the Z direction (or Z job selections).

Below the manipulator selection icons 640, are stage selection, tilt selection, theta selection, live image selection and freeze image selection icons which allow the system user to perform the stated task and/or select from a variety of available tasks for the stated feature. For example, the system operator could select the stage select icon and then select from any of the stage mechanisms discussed above including the theta drive 311, X, Y and Z stage 312, 314 and 316, or microscope stage (or platform stage) coupled to platform 544. An auto start feature may be provided for the software interfaces which will provide the system user with quick and easy images from which to start.

FIGS. 22A–B reflect how the PCPII software has been created and/or modified to control both the SEM 104 and the probe station components including probe assemblies 106, carrier 250 and stages 311, 312, 314, 316, 702 and 704. In a preferred form of system 100, the SEM imaging software supplied with SEM 104, was only setup to be run with an ActiveX component having specific names and interfaces. Since the ActiveX component is the only way to interface other components with SEM 104, the PCPII software of system 100 was redesigned to handle both the SEM imaging and control, and the probe station navigation (pcNav) and video (pcVideo). The pcNav and pcVideo are collectively referred to herein as the probe station application.

A pcRouter Dynamic Data Exchange interface was created to allow the 16 bit probe station application (probe station navigation and video) to work in conjunction with the 32 bit SEM control application. Since both applications are competing for system resources, a preferred form of system 100 turns the SEM imaging application off when navigation is desired, and turns the navigation application off when SEM imaging is desired. Thus, when the system user is done viewing a target with the SEM 104 and desires to move to a new target on DUT 118, the SEM imaging application is shut off and the pcNav application is operated. In this way the user can move from conductive path indicia on one die to other conductive path indicia on the same die or on other dies located on the DUT 118. Conversely, when SEM imaging is again desired, the pcNav application can be shut off and the SEM imaging turned back on so that SEM 104 can begin scanning the target specimen and system 100 can display a high resolution image. This configuration ensures that all motion control functions will be initiated from the ActiveX navigator in the SEM 104.

The optional joystick or pendant control 40 discussed above with respect to the operation of the system 100 can be used in conjunction with the PCPII software interface and is implemented by using an application such as pcLaunch to take over the operating system of the controller, (e.g., to take over WINDOWS). More particularly, when a movement in the joystick or input device is made, pcLaunch is activated thereby taking control of the operating system. Once this event occurs, the SEM imaging application is shut off so that the desired navigation function can be performed. Once navigation is complete, the navigation application (including the joystick navigation controls) is shut off and the SEM imaging application is turned back on.

Thus, PCPII provides an interface for allowing the system user to both control the SEM 104 and the probe station including its many components, (e.g., the carrier 250, probe assemblies 106, drives and stages 311, 312, 314, 316, 702 and 704, etc.). With the interfaces described a system user can position individual probes, as well as multiple probes, wafer (or carrier) stages 311, 312, 314, 316, 702 and 704, platen 258, and probe assemblies 106 including the various stages of manipulators 252a–d. More particularly, the probe assembly controls and high resolution microscope controls can be integrated together with auto scaling to the SEM image in on the screen (the active image), which allows for the click-n-drag navigation to be used. Furthermore, the positioning controls of system 100 are kept from being effected by the image update time of microscope 104. For example, the click-n-drag navigation of the software interfaces described above allows for precise placement of probes without concern for the amount of time microscope 104 takes for image updating.

The above have provided needed advances in probe station technology, however, there remains additional problems associated with unwanted movement or drift of the various stage elements or positioning equipment of probe stations. For example, in the high resolution probe station 100, each axis of the positioning equipment is driven by constantly energized stepping motors which, in turn, generate heat. As mentioned above, the generation of heat in vacuum chamber 190 allows for thermal buildup within the housing and the resultant drift due to the thermal expansion of component materials within the housing 102. Although the drift effects of thermal expansion have been reduced by selecting materials with low coefficients of thermal expansion as discussed above, there remains some drift even after utilizing these materials. Thus, system 100 has been provided with an additional means for accounting for the remaining unwanted movement or drift in probe station components.

More particularly, system 100 includes a method and apparatus for keeping a probe accurately positioned relative to the specimen 118 (or device to be tested). The system 100 will position a probe 256 at a predetermined test point on the specimen 118 via a drive assembly, and will then begin testing. The controller 50 will determine if there is a variance, such as due to drift, between the current position of the probe 256 and the test position on the specimen 118 and will take corrective action after a predetermined drift amount has been reached. In a preferred form, this determination will be made periodically and the corrective action taken will be the actuation of at least one drive assembly to keep the probe 256 accurately positioned on the specimen 118.

The controller 50 may determine the variance by accessing data stored in memory or from sensors detecting actual movement of the system's positioning equipment. For example, in one form, the controller 50 accesses data corresponding to the drift of the positioning equipment or drive assemblies, such as drift rates for these elements of system 100. From this information, the controller 50 determines whether the predetermined amount of drift has been reached and, if so, actuates the necessary drive assemblies to counter the drift and keep the probe 256 accurately positioned on the specimen 118. In a preferred form, the predetermined amount of drift corresponds to the resolution of the microscope 104 used in system 100 and is set specifically so that the only amount of drift allowed is that which can go undetected by the microscope 104 due to its resolution and does not affect the testing of the specimen 118.

The controller 50 can also determine the drift by acquiring data from a sensor. In a preferred form, the sensor is electrically connected to the controller 50 which, in turn, actuates the necessary drive assemblies after the predetermined amount of drift has been reached (as discussed above).

Figure 9:
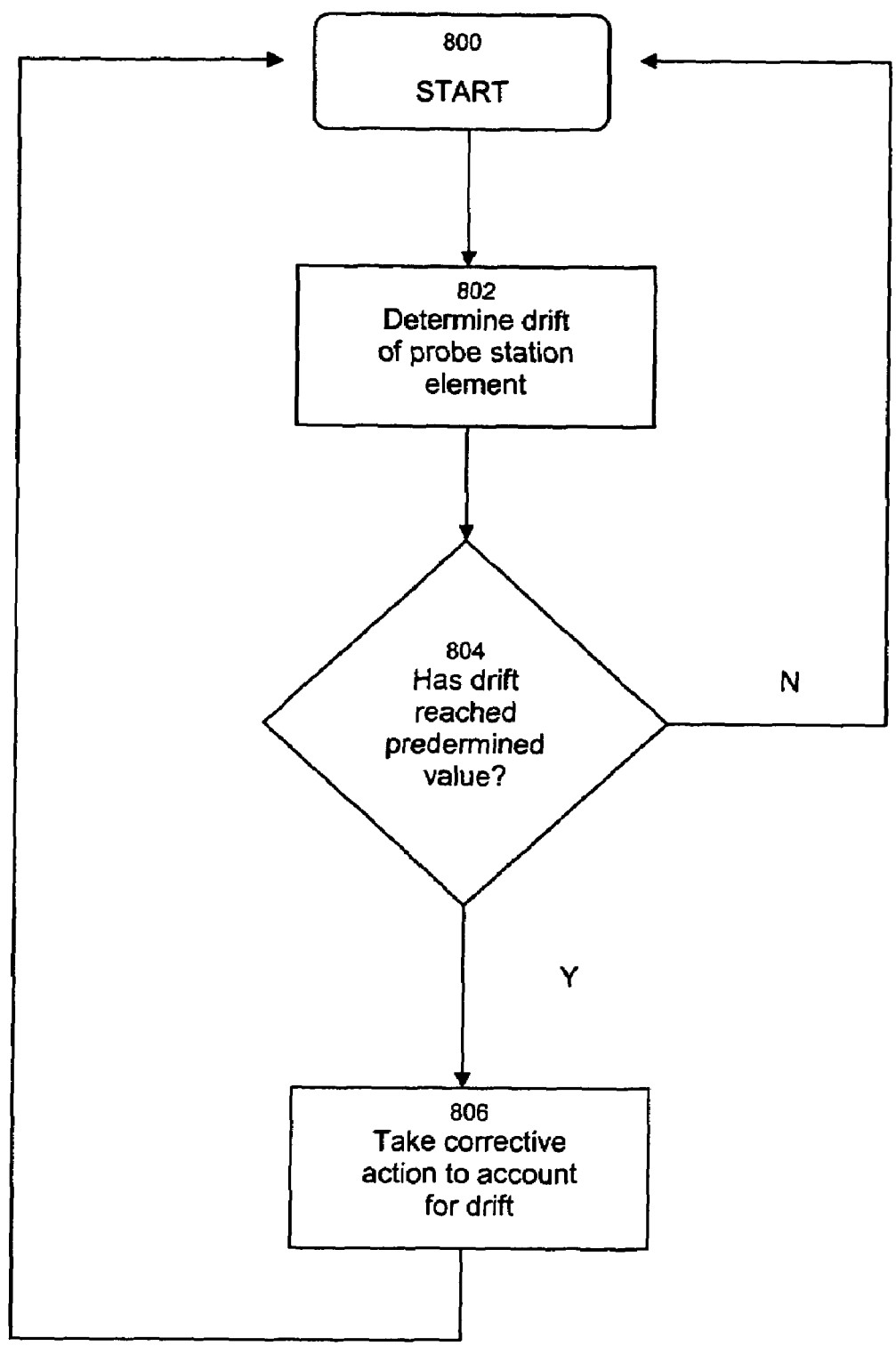
FIG. 9 is a flow chart of a drift correction routine run by the controller to account for heat induced drift in the probe station.

FIG. 9 is an upper-level flow chart of the general drift correction technique used to accomplish the feat of keeping the probe 256 accurately positioned on the desired test position of specimen 118. After initiating the drift correction technique in step 800, controller 50 will determine the drift of at least one of the probe station elements or positioning equipment (e.g., such as control mechanisms 540 including tilt/tip mechanism 542, theta drive 311, carrier X, Y and Z stage drives 312, 314 and 316, platform X and Y stages 702 and 704, manipulator X, Y and Z stage drives 354, 356 and 358, and the like) in step 802. The controller 50 then checks to see if the drift has reached a predetermined value in step 804 in order to determine if action need be taken in response to the drift. If the drift has not reached the predetermine value, the controller returns to step 800 and starts the drift compensation routine again. If, however, the drift has reached a predetermined value, the controller 50 takes action to account for the drift in step 806 and then returns to step 800 and restarts the drift compensation routine again. The predetermined value preferably is set on a per axis basis.

Alternatively, the value can be a resultant of X, Y and Z axes movements so that the drift is limited by the set predetermined value.

The predetermined value which causes the controller to take action or respond to drift may be set at any value. For example, this value may be adjusted via a user interface such as drift correction settings screen 810 illustrated in FIG. 10. This screen may be integrated into the navigation control portion of the PCPII software and can be used to adjust a variety of software settings. In the form illustrated, the predetermined value which causes the controller 50 to take action or respond can be adjusted by simply adjusting the predetermined drift value 812. If an operator desires system 100 to allow no drift or minimal drift, the predetermined drift value 812 may be set equal to zero or very near zero so that the system continually operates to keep the probes 256 in the desired position. Continuously operating the software in this manner, however, ties up valuable computer resources and typically is not required to conduct accurate probing or testing of specimen. Therefore, in a preferred form of system 100, the drift value 812 is set to a value greater than zero and preferably to a value representative of the resolution of the microscope 104 or of the acceptable positioning tolerance of the component or specimen being tested.

Typically, the values representative of the microscope resolution or specimen tolerance will allow the system elements to drift a certain distance without requiring a correction to be made because there is no immediate need to make a correction or take action. This allows the system 100 to make efficient use of its resources. In a preferred form, the drift value 812 corresponds to the resolution of the microscope 104 so that a system positioner or element is allowed to drift until such drift is about to become noticeable through the display 35 due to the microscope's resolution. Thus, prior to the drift becoming noticeable to the system user, the controller 50 takes action to counter the drift that has taken place. In most instances, tying the drift value 812 to the microscope resolution will also keep the drift within the tolerances provided for the specimen 118 because the amount of drift representative of the resolution of the microscope 104 is typically much smaller than the amount of drift representative of the acceptable positioning tolerance of the specimen 118.

Although the units depicted for the drift value 812 in the high resolution probe station embodiment discussed herein are nanometers, it should be understood that any value and units may be selected for the drift value 812 because the drift compensation method and apparatus may be applied to a variety of probe station configurations with varying resolution and tolerance requirements.

The actual drift rate associated with the various control mechanisms 540, (e.g., the X, Y and Z drives for manipulators 252a–d, the X, Y and Z drives for carrier 250, the X, Y and Z drives for platform 544), may be entered in the drift correction settings window 810. For example, in the form illustrated in FIG. 10, the drift rate for the X-stage of manipulator 252a is negative eight-hundred nanometers/hour (nm/hr), the Y-stage of this manipulator is positive eight-hundred nm/hr, and the Z-stage of this manipulator is zero. These values represent the calculated amount of correction needed in the X, Y and Z directions per hour. The negative and positive symbols represent which direction the particular X, Y or Z stage drifts in over time. Thus, when a correction is made, a negative value will indicate to the controller that movement must be made in the positive direction and a positive value will indicate that movement must be made in the negative direction. Again, although the drift rates are input in nm/hr, it should be understood that any values and units may be used for the drift rate. In order to simplify the drift correction program, the units entered for the drift rate should match the units entered for the drift value 812. However, in alternate forms, the drift correction program may be setup to make the necessary conversions when drift rate and drift value are entered in different units.

Once the drift rates for these probe station elements have been set and the predetermined drift value 812 has been selected, the X and Y drift correction may be enabled by selecting box 816 and the Z drift correction may be enabled by selecting box 818. Although the software program and window 810 could be setup to enable the X, Y and Z drift correction via the selection of one box, in the form illustrated, the X and Y enablement is separate from the Z enablement because many applications will not need Z drift correction. For example, some probe stations 100 are provided without Z drives; thus, there is no need to enable Z drift correction. Other probe stations may have a greater tolerance for Z drift than for X and Y drift; thus, Z drift correction may not be desired. Alternatively, in other embodiments, the software program and window 812 may be setup to enable X, Y and Z drift correction independently of one another so that any combination of X, Y and Z drift may be accounted for.

The drift rates for the positioners or control mechanisms are somewhat linear, predictable and repeatable, and can be determined in several ways. For example, a feedback mechanism, such as a sensor, linear scale, photo-optic pair, laser or strain gauge, may be connected to an element axis of the system 100 (e.g., an X, Y or Z axis) in order to track drift along the element axis over time. As will be disclosed further below, the feedback mechanism itself can be used in place of the software look-up table 810 for determining drift, however, such devices are expensive and not easily mass produced due to their miniature size and fragility. Therefore, in a preferred form, the feedback mechanism or sensor is only used to calculate the initial drift correction settings for system 100, which are then programmed into the look-up table 810 stored in memory. Furthermore, given the difficulty in determining the drift correction settings and the effect the drift compensation software routine 800 can have on the calibration of the system 100, the window settings 810 are preferably configured as a hidden window and/or read only so that inadvertent or unwanted changes cannot be made thereto. For example, in the embodiment illustrated in FIGS. 9 and 10, the drift setting parameters of the system elements are stored in a read-only binary file which is hidden so that the system user cannot edit the parameters directly. The enablement options 816 and 818 and Hold Position buttons 820a–f (which will be discussed further below) may, however, be made accessible by a user so that the X, Y and Z correction software can be turned on and off as desired.

Figure 10:
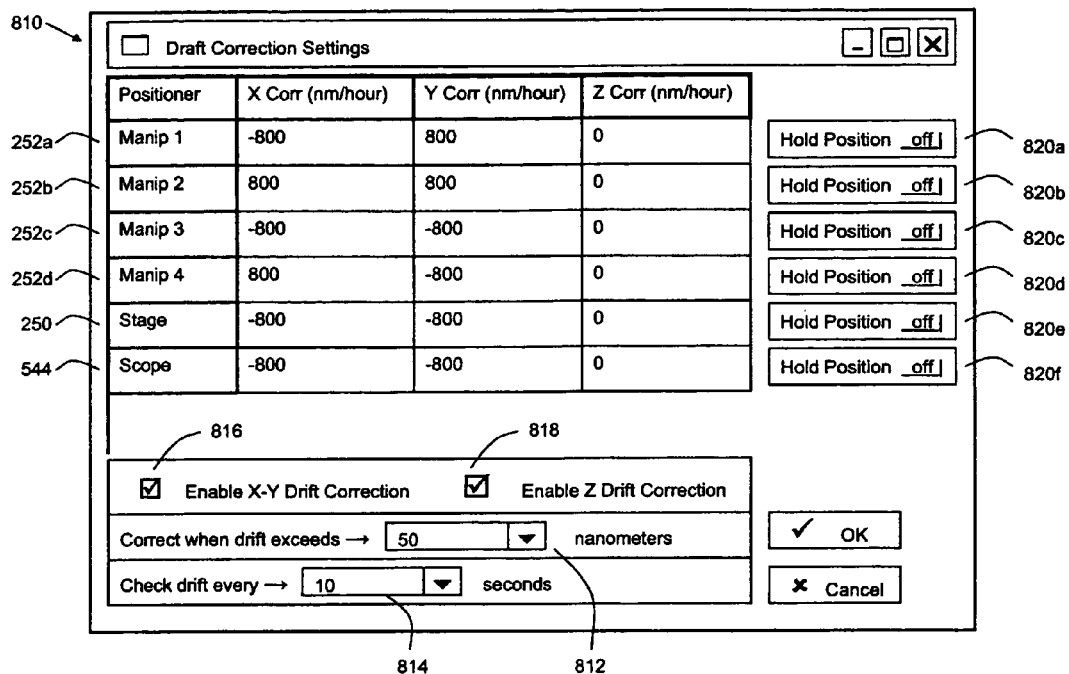
FIG. 10 is a view of a hidden screen accessible via the probe station computer for enabling drift correction and/or accessing drift correction settings.

In a preferred form, the number of times the controller 50 performs the drift check may also be changed via the drift correction settings window 810 by simply altering the drift check value 814. By way of example and not limitation, the drift check value 814 may be set to ten seconds (as illustrated in FIG. 10) so that the controller 54 does not have to continually check drift and can make more efficient use of system resources. Alternatively, if continual checking of the drift is desired for any of the control mechanisms 540, the drift check 814 may be set to zero so that the drift correction routine 800 runs continuously.

In screen 810, the Hold Position buttons 820a–f enable and disable the use of drift correction for the associated positioner or control mechanism (e.g., in this embodiment, stages for manipulators 252a–d, stages for carrier 250 and stages for platform 544). More particularly, if the Enable X-Y Drift Correction box 816 has been checked to enable X-Y drift correction and the system user does not want to enable drift correction for one of the manipulators 252a–d, carrier 250 or platform 544, the Hold Position button associated with that positioner can be turned off so that no drift correction will be made for that element of the probe station 100. Thus, enablement boxes 816 and 818 enable or disable the drift correction for the entire system 100, and Hold Position buttons 820a–f enable or disable specific elements of the system 100.

Using the exemplary values listed in FIG. 10, if the drift value 812 is set to fifty nanometers, the drift rates from the control mechanisms 540 are +800 nm/hr or −800 nm/hr, the drift check is set to ten seconds, and the Hold Position buttons 820a–f are on (i.e., enabling drift correction), the control mechanisms 540 drift 0.22 nm/second, or 50 nm in 227.27 seconds. Thus, when the absolute value of the actual drift exceeds the drift value of 50 nm, the controller 50 will actuate the X, Y and Z screw drives associated with the manipulators 252a–d, the carrier 250, and the platform 544 to drive the control mechanisms or probe elements in the opposite direction of their respective drift. Since the drift check is set for ten second intervals, a 51.1 nm correction will be made every 230 seconds (or 3.83 minutes).

Thus, in the embodiment illustrated, the controller 50 detects drift by accessing the drift correction setting data stored in memory and displayed in FIG. 10 to determine the amount of drift that has taken place. If the amount of drift detected has reached the predetermined amount of drift set in screen 810, (e.g., drift value 812), the controller 50 actuates the necessary control mechanisms or drives to correct the drift that has occurred or compensate for the unwanted movement and keep the probe accurately positioned on the desired test point of specimen 118. Since the software allows for different X, Y and Z drift rates, the actual corrective action taken may involve a variety of the system's X, Y and Z drives.

In an alternate embodiment, the software and/or user interface may provide additional buttons, such as drift check override buttons, that are associated with specific positioners and allow the positioners to be continuously monitored or checked regardless of the drift check value 814 set for the system as a whole. This allows drift correction or compensation for the individual control mechanisms to be controlled independently of one another. Thus, the drift check for one control mechanism may be different than another mechanism, (e.g., more or less frequent). For example, if probe station 100 is testing a specimen 118 which requires a very tight carrier 250 drift tolerance, but has relatively loose or lax manipulator 252a–d and platform 544 drift tolerances, the drift check override button corresponding to carrier 250 may be turned on for continual drift checking or compensation of that element and the remainder of the drift check override buttons may remain off so that drift for these elements is compensated according to the settings for drift value 812 and drift check 814 (if enabled).

In yet other forms of system 100, different stage drives of control mechanisms may also be provided with drift check override buttons so that drift for one of the component stage drives may be compensated differently than drift for the other component stage drives. In other words, drift along one control mechanism axis of travel, (e.g., the X axis), may be monitored differently from the control mechanism's other axes of travel (e.g., Y and Z). For example, if probe station 100 is used to test a specimen 118 which requires a very tight carrier 250 drift tolerance in the X direction of travel, but has relatively loose carrier 250 drift tolerances in the Y and Z directions of travel, the drift check override button corresponding to the X-direction carrier drift may be turned on for continual drift checking or compensation and the drift check override buttons for the Y and Z carrier drift directions may remain off so that drift for these elements is compensated according to the settings for drift value 812 and drift check 814 (if enabled). Since additional computer resources are tied up with each positioner or control mechanism 540 being continually checked, the probe station 100 will work most efficiently when a minimal number of drift check override buttons are on.

Figure 11:
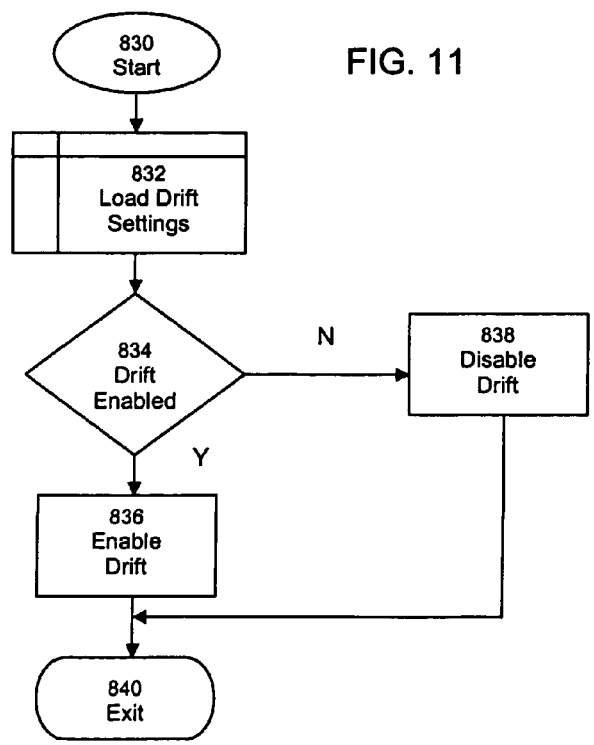
FIG. 11 is a flow chart of an initialization routine capable of being run by the controller to enable drift correction.
Figure 12:
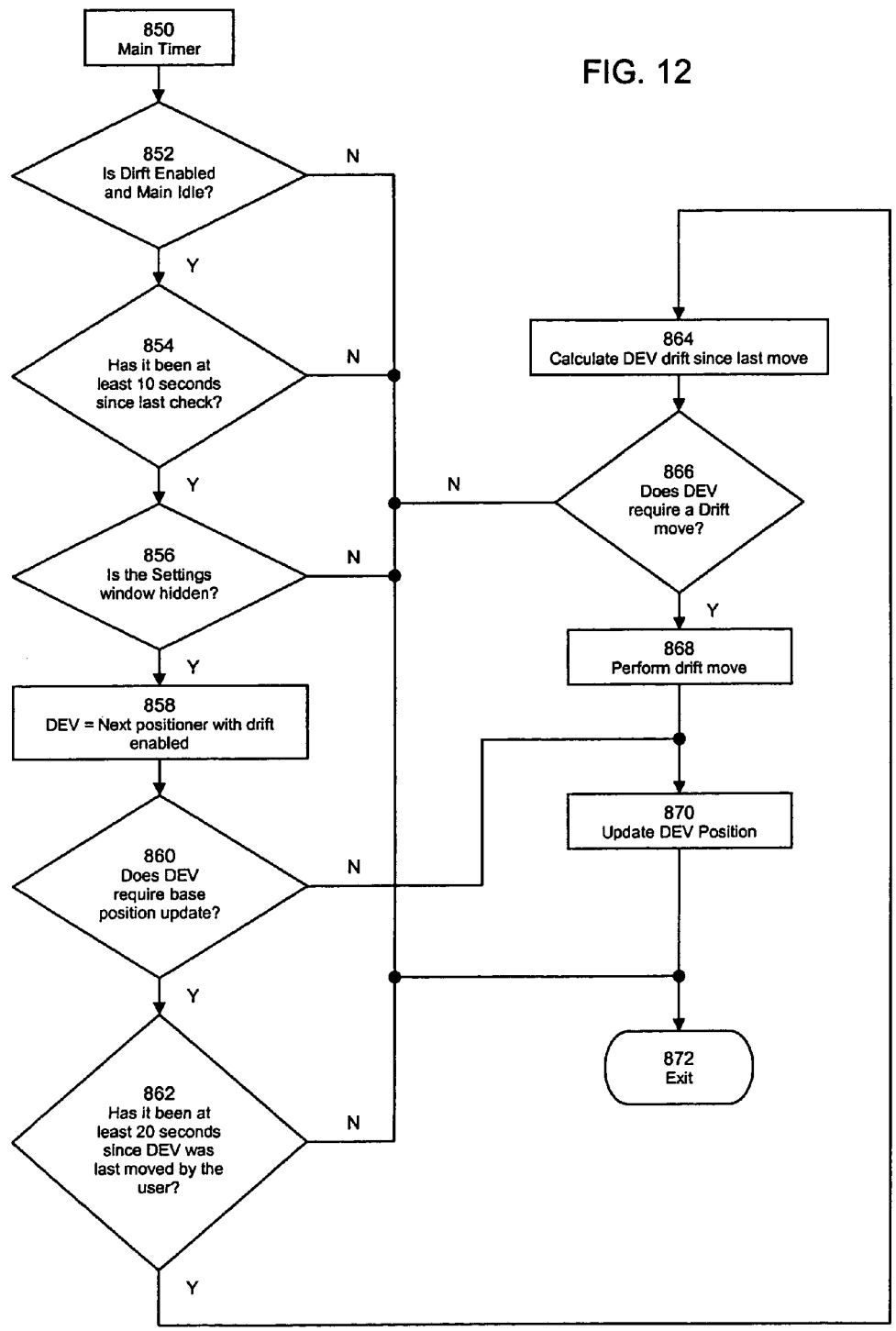
FIG. 12 is a flow chart of a drift correction routine capable of being run by the controller to account for drift in the probe station.

FIGS. 11 and 12 provide more detailed flow charts of the PCPII software illustrated in FIG. 10 and attached in the Computer Program Listing Appendix hereto. For convenience, the exemplary drift settings from FIG. 10 are used hereafter for reference. Before checking for drift, the controller 50 enters an initialization routine in step 830 (FIG. 11) and the drift settings from window 810 are loaded in step 832. In step 834, the controller checks the settings to determine if drift correction has been enabled. If yes, the controller enables drift correction in step 836 and exits the initialization routine at step 840. If no, the controller disables drift correction in step 838 and exits the initialization routine at step 838.

Once exited from routine 830, the controller begins checking for drift. As illustrated in FIG. 12, the controller checks the main timer in step 850 and, in step 852, determines if drift correction has been enabled in routine 830 and if the main timer is idle. If drift correction has not been enabled or the main timer is not idle, the controller 50 exits drift checking routine 850 via step 872. Alternatively, if drift correction has been enabled and the main timer is idle, the controller checks to see if the specified check drift time period 814 (e.g., 10 seconds) has expired in step 854. If the check drift time period 814 has not expired, the controller exits the checking routine 850 via step 872. If the time period 814 has expired, the controller checks to see if the settings window 810 (FIG. 10) is hidden in step 856.

If settings window 810 is not hidden, the controller exits the routine at step 872. If the window 810 is hidden, the controller sets parameter DEV (for device) equal to the next positioner or motion control element with drift correction enabled in step 858. Thus, if starting from the top of window 810 in FIG. 10, the Hold Position buttons 820a–b for manipulators 252a–b are off and the Hold Position button 820c for manipulator 252c is on, the controller 50 will set parameter DEV equal to manipulator 852c in step 858.

In step 860, controller 50 checks to see if the selected device (i.e., DEV) requires a base position update because some movement has been made. If no base position update is needed, the controller restores the current base position as the DEV position in step 870 and exits the routine at step 872. If a base position update is needed, the controller checks to see if a predetermined amount of time has lapsed (e.g., 20 seconds) since the device (DEV) was last moved by the user. If the predetermined amount of time has not lapsed, the system assumes it is too close to a user instructed movement to determine if any drift has occurred and, therefore, exits the routine at step 872. If the predetermined amount of time has lapsed, the controller calculates the amount the device (DEV) has drifted since its last movement and determines, in step 866, whether some action, such as a corrective movement, needs to be taken in response to the amount of drift that has taken place.

If no action needs to be taken in response to the amount of drift detected in step 866, the controller exits the routine at step 872. If, however, action needs to be taken in response to the amount of drift that has taken place (e.g., a drift move needs to be made), the controller 50 performs the necessary action or movement in step 868 to account for the drift. After the necessary action has been taken, the controller 50 stores the device's new position as the updated device position in step 870 and exits the routine in step 872.

Once drift check routine 850 has been exited, the PCPII software may either return to the beginning of the drift check routine 850 or require the initialization routine 830 to be re-run before restarting the drift check routine 850 again. In a preferred embodiment, the software will check to see if the initialization routine has been recently run and, if so, simply re-run the drift check routine 850 after exiting step 872. If the initialization routine has not been recently run, the controller 50 will re-run this routine to determine if any of the drift correction settings have been changed.

Figure 13:
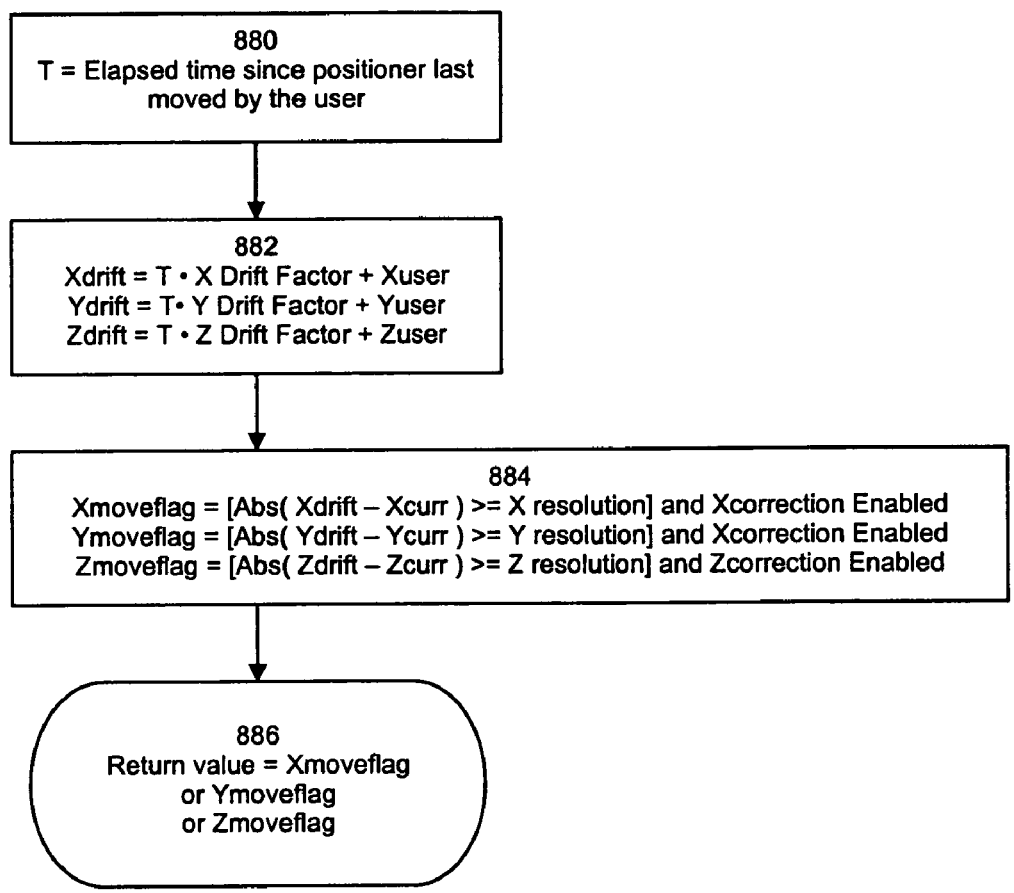
FIG. 13 is a flow chart of a drift calculation routine capable of being run by the controller to account for drift in the probe station.

A flow chart of the positioner drift calculation used in the above-described embodiment is illustrated in FIG. 13 and begins, in step 880, with the controller 50 setting the variable T equal to the elapsed time since the positioner in question has last been moved by the user. The controller 50 then sets variable Xdrift equal to the elapsed time T multiplied by the sum of the X drift factor and the amount the user moved the device in the X direction. The controller 50 sets variable Ydrift equal to the elapsed time T multiplied by the sum of the Y drift factor and the amount the user moved the device in the Y direction. Lastly, the controller 50 sets variable Xdrift equal to the elapsed time T multiplied by the sum of the Z drift factor and the amount the user moved the device in the Z direction.

Once this is completed, the controller 50 determines if the absolute value of the difference between Xdrift and the current X.value (e.g., Xcurr) is greater than or equal to the X resolution. If it is, and the X correction has been enabled, the controller sets the Xmoveflag variable equal to the calculated absolute value and returns this value as the amount of drift needed to be accounted for in the X direction via step 886. Similarly, the controller determines if the absolute value of the difference between Ydrift and the current Y value (Ycurr) is greater than or equal to the Y resolution. If it is, and the Y correction has been enabled, the controller sets the Ymoveflag variable equal to the calculated absolute value and returns this value as the amount of drift needed to be accounted for in the Y direction via step 886. Lastly, the controller 50 determines if the absolute value of the difference between Zdrift and the current Z value (Zcurr) is greater than or equal to the Z resolution. If it is, and the Z correction has been enabled, the controller sets the Zmoveflag variable equal to the calculated absolute value and returns this value as the amount of drift needed to be accounted for in the Z direction via step 886.

Thus, using the example from FIG. 10 above and assuming Hold Position buttons 820a–b are off and Hold Position button 820c is on and the predetermined time periods have all been met, the controller 50 will start the initialization routine 830 and load the drift settings from window 810 via step 832. In step 834, the controller 50 will determine that the X-Y Drift Correction and Z Drift Correction have been enabled and will enable drift correction in step 836. After this is done, the controller exists the initialization routine at step 840 and the main timer is loaded in step 850. In step 852, the controller 50 checks to see if drift correction has been enabled in routine 830 and if the timer is idle. Upon confirming that drift correction has been enabled and that the main timer is idle in step 852, the controller confirms that at least ten seconds have past since the last drift check in step 854 and confirms that the settings window 810 is hidden in step 856.

The controller 50 then sets the device equal to manipulator 252c (e.g., DEV=Manip 3) in step 858 and checks to see if the device has drifted or requires a base position update in step 860. The controller 50 will then confirm that it has been at least twenty seconds since the system user has moved manipulator 252c in step 862 and will calculate the amount the device has drifted in step 864. Base on this example, the controller 50 will confirm in step 866 that action (e.g., a drift move) needs to be taken in response to the amount of drift that has taken place and will perform the necessary drift move in step 868. Therefore, The controller then confirms that would determine if the device has moved more than 50 nm, which was the threshold for taking action in response to drift.

Using the numbers from FIG. 10, (e.g., −800 nm X and Y drift rates, 0 nm Z drift rate, 50 nm drift value, and 10s intervals), the controller 50 will actuate both the X and Y stages for manipulator 252c 51.1 nm in the positive X and Y direction, respectively.

Referring now to the Computer Program Listing Appendix attached hereto, the software disclosed therein uses measured drift characteristics for each axes of movement to determine the corrective movement required to generally maintain a probe 256 in its desired test position. Thus, in a preferred form, the controller 50 will access the look-up table illustrated in FIG. 10 to obtain the drift correction settings required to determine when and how much drift correction is needed. In this embodiment, the drift correction move is calculated as:

$$DriftPosition = ElapsedTime \times DriftFactor + Probe\ Position$$

Where:
DriftPosition=Axis Position required to maintain physical position;
Elapsed Time=Time since last user directed move;
DriftFactor=Measured drift per unit time;
Probe Position=Probe position immediately after last user directed move.

The drift position moves are performed when the difference between the current axis position and the drift position exceeds the required positioning resolution. Therefore, the axis must move when:

$$|Probe\ Position - CurrentPosition| \geq Resolution$$

Where:
CurrentPosition=Current reported position of the axis; and
Resolution=Required resolution to maintain probe position.

Thus, by way of example and not limitation, if the physical position of a probe is desired to be maintained within ±0.05 microns and the drift of an axis is 2 microns per hour, a corrective movement of 0.05 microns must occur every ninety seconds to generally maintain the probes physical position.

In an alternate embodiment, the apparatus herein, including its controller and operating software, further account for drift by reducing the amount of current supplied to the various motion control elements, or portions thereof, when these devices on not in operation. For example, after a predetermined amount of time has gone by since a positioner or motion control element has been actuated by the user, controller 50 reduces the amount of current supplied to at least a portion of the motion control element, such as a stepper motor, in order to minimize the amount of heat generated by the motor. By reducing the generated heat from the motor, the system is helping reduce the amount of thermal buildup that causes thermal expansion of system components and the associated drift therewith.

Thus, the system 100, as described above, is a fully functional probe station incorporating high resolution microscopy in order to allow a system user to accurately probe structures down to 0.1 µm or smaller. The system 100 is capable of conducting low voltage/low current testing in a low noise environment and can pump down in less than five minutes. More particularly, the high resolution SEM microscope 104 offers sufficient resolution to probe 100 nm features and offers a magnification range of 15× to 25 k×.

In order to keep the probes 246 accurately positioned relative to the specimen 118 and account for environmental conditions, such as thermal buildup, which may cause unwanted movement or drift, the system 100 has been designed with several drift fighting features. For example, the drive mechanisms of system 100 provide heat radiators for probe drift caused by thermal expansion as discussed above and offer high precision lead screw drives which offer high resolutions with large ranges of motion. In a preferred form, the platform stage may be moved up to one inch (25 mm) and allow for X and Y travels approximately equal to 0.25 inches. The manipulators utilized offer the ability to stay on submicron devices for extended periods of time without damaging the DUT or sliding off the target. The preferred manipulators offer X, Y and Z travel of approximately 12.5 mm with a position resolution of 50 nm. The X and Y stages 312 and 314 have the ability to travel approximately 200 mm in the X and Y direction with a resolution of 0.1 µm and an accuracy or repeatability of ±1.5 µm. In addition, the preferred theta drive offers 100 of travel with 0.7 µm of resolution and the ability to be controlled by the joystick/pendant or software interface.

The probes are designed with probe link arms that are capable of further dampening vibration and can give strong support to the probes. The probes 256 can all be placed within one square micron or less and four probes can be placed within one square µm area. A variety of different probe tips may be used with the probes of system 100, including concave, convex and nipple tipped configurations. For example, concave tips which are very sharp but not very durable, can be used in applications where a low Z forces are desired to be applied to the DUT. Convex tips which are durable but have no point, can be used in applications where it is desired to penetrate (or punch through) oxides or in applications where probes that exert a large amount of force are desired. Nipple tips are both durable and sharp and find uses in a variety of applications.

The system can further image at low beam voltages and can blank the beam to prevent damage to DUTs and allow for low current measurements (e.g., sub-femto ampere measurements) to be taken. The beam voltage can be varied from a preferred range of 1.5 kV to 20 kV.

The software of system 100 also allows for the system user to interface with CAD navigation systems and equipment, and gives the system operator the ability to combine control and microscope images on one screen. The software and controller 50 also allow the user to enable drift correction techniques which can account for unwanted movement in the components of the probe station 100.

Thus it is apparent that there has been provided, in accordance with the invention, a method and apparatus for keeping a probe accurately positioned relative to a specimen that fully satisfies the objects, aims, and advantages set forth above. While there has been illustrated and described a preferred embodiment of the present invention, it will be appreciated that modifications may occur to those skilled in the art, and it is intended in the appended claims to cover all those changes and modifications which fall within the true spirit and scope of the present invention.

What is claimed is:

1. A method for keeping a probe accurately positioned relative to a device to be tested, the method comprising:
    shifting at least one of the probe and the device to a predetermined relative position therebetween for testing the device at a predetermined location thereon;
    viewing the probe and the device with a microscope having a predetermined resolution;
    determining a variance between a current relative position between the probe and the device and the predetermined test position; and
    adjusting the current relative position to generally maintain the variance below a predetermined amount.

2. The method of claim 1 wherein the variance between the current relative position and the predetermined test position is due to thermal expansion and adjusting the current relative position comprises adjusting the current relative position to generally maintain the variance below the predetermined resolution of the microscope during testing.

3. The method of claim 1 wherein the probe or device are shifted to the predetermined testing position in a vacuum chamber in which the device is located, and the probe and device are viewed with a high resolution microscope.

4. The method of claim 1 wherein the variance is determined by measuring a drift rate along at least one axis of movement, and
    determining whether the variance has exceeded the predetermined amount based on time elapsed since a prior shifting of the probe or device and the drift rate.

5. The method of claim 1 wherein the probe or device are shifted in X and Y directions, the variance is determined in the X and Y directions, and the relative position is adjusted in the X and Y directions as needed based on the amount of the variance.

6. The method of claim 1 wherein the variance is determined at a predetermined time interval and the relative position is adjusted when the determined variance equals or exceeds the microscope resolution.

7. The method of claim 6 wherein the variance is determined based on a predetermined drift rate for each axis of movement of the probe or device.

8. The method of claim 7 wherein the probe or device are shifted by a motor with heat generated by operation of the motor causing the probe or device to vary from the predetermined test position in a direction along at least one movement axis, and the relative position is adjusted by actuating the motor to shift the probe or device in a direction opposite to the direction moved along the movement axis.

9. The method of claim 1 wherein the probe or device are shifted under command of a controller which determines the variance and automatically adjusts the probe or device position to generally maintain the variance below the microscope resolution.

10. The method of claim 1 wherein the probe or device position adjustment is caused by a controller when the variance is equal to or greater than the microscope resolution.

11. The method of claim 1 wherein the probe or device are shifted via shift mechanisms employing preselected materials having low thermal conductivity or low thermal expansion coefficients.

12. The method of claim 1 wherein the probe or device are shifted by a motor which operates positioning components for the probe or device, and
heat shielding the positioning components to redirect heat generated by motor operation away from the positioning components.

13. The method of claim 1 wherein the variance is determined based on predetermined drift rates for each axis of movement of the probe or device, and
keeping the drift rates to approximately 1 to approximately 3 microns per hour by employing a heat shielded motor and positioning components operated by the motor that are of materials having low thermal conductivity or low thermal expansion coefficients.

14. The method of claim 13 wherein the probe or device position is adjusted at time intervals that are preselected based on the drift rates to substantially keep the variance at or below the predetermined resolution of the microscope.

15. The method of claim 14 wherein the microscope is a high resolution microscope having a resolution of approximately 0.05 microns.

16. The method of claim 1 wherein the variance is determined by monitoring the position of the probe or device after they have been shifted to the testing position and the relative position is continuously adjusted based on the monitored position.

17. An apparatus for keeping a probe accurately positioned relative to a device to be tested, the apparatus comprising:
a probe;
a movable probe station element for positioning the probe at a predetermined test position on the device to be tested;
a drive for moving the probe station element to position the probe at the test position; and
a controller connected to the drive and operable to actuate the drive after a predetermined amount of variance between a current probe position and the predetermined test position has been reached.

18. An apparatus according to claim 17 wherein the movable probe station element comprises a stage for moving at least one of a platform, a carrier and a manipulator, the apparatus further comprising:
a high resolution microscope for viewing the device to be tested; and
a vacuum chamber enclosing at least a portion of the probe, movable probe station element, drive and microscope for reducing sources of noise which may affect testing of the device to be tested.

19. An apparatus according to claim 17 further comprising a microscope having a resolution suitable for viewing the device to be tested; and
the controller is programmed to determine the variance and actuate the drive after the variance has reached a predetermined value corresponding to the microscope resolution.

20. An apparatus according to claim 19 wherein the predetermined value is equal to or greater than the resolution of the microscope.

21. An apparatus according to claim 17 wherein the apparatus further comprises a memory containing data which the controller can use to determine the variance between the current probe position and the desired test position.

22. An apparatus according to claim 20 wherein the memory data comprises a look-up table having values which correspond to the variance between the current position of the probe and the desired test position.

23. An apparatus according to claim 22 wherein the values comprise at least one of a drift rate, a drift actuation value, and a drift check interval value.

24. An apparatus according to claim 21 further comprising a user interface which allows an operator to insert or edit the data corresponding to the variance between the current position of the probe and the desired test position.

25. An apparatus according to claim 17 further comprising a sensor electrically connected to the controller to assist the controller in detecting the variance between the current position of the probe and the predetermined test position.

26. An apparatus according to claim 25 wherein the sensor comprises at least one of a mechanical sensor, a magnetic sensor, and an optical sensor.

27. An apparatus according to claim 26 wherein the sensor comprises a linear switch capable of indicating the variance between the current probe position and the predetermined test position so that the probe may be generally maintained in the desired test position.

28. An automated probe station capable of keeping a probe accurately positioned relative to a DUT, the probe station comprising:
a probe for being positioned about a DUT so that the probe and the DUT are located at a predetermined relative position for testing of the DUT in a predetermined test position;
a manipulator for shifting the probe to the predetermined test position;
a platen for supporting the manipulator and having at least one platform stage;
a carrier for supporting the DUT and having at least one carrier stage;
drives for the manipulator, the platform stage, and the carrier stage, to allow the probe and the DUT to be shifted to the predetermined test position; and
a drift controller for determining a variance between a current position of the probe and the test position and selectively actuating the drives to generally maintain the probe and the DUT in the test position.

29. An apparatus according to claim 28, wherein the drift controller includes a processor including software programmed with a look-up table which the controller uses to determine a drift rate corresponding to the variance between the current position of the probe and the test position over a period of time due to thermal expansion.

30. A probe station according to claim 29, wherein the controller actuates at least one of the drives when the drift rate reaches a predetermined value.

31. An apparatus according to claim 29, further comprising a software interface which allows a user to edit the look-up table.

32. An apparatus according to claim 28, further comprising a sensor for detecting the variance between the current position of the probe and the test position, and the drift controller actuates at least one of the drives when a predetermined amount of variance is detected.

* * * * *